US011074129B2

(12) United States Patent
Horn

(10) Patent No.: US 11,074,129 B2
(45) Date of Patent: Jul. 27, 2021

(54) ERASURE CODED DATA SHARDS CONTAINING MULTIPLE DATA OBJECTS

(71) Applicant: Western Digital Technologies, Inc., San Jose, CA (US)

(72) Inventor: Robert Horn, Yorba Linda (CA)

(73) Assignee: Western Digital Technologies, Inc., San Jose, CA (US)

( * ) Notice: Subject to any disclaimer, the term of this patent is extended or adjusted under 35 U.S.C. 154(b) by 4 days.

(21) Appl. No.: 16/669,853

(22) Filed: Oct. 31, 2019

(65) Prior Publication Data

US 2021/0133026 A1 May 6, 2021

(51) Int. Cl.
G06F 11/10 (2006.01)
H03M 13/15 (2006.01)

(52) U.S. Cl.
CPC ....... *G06F 11/1076* (2013.01); *H03M 13/154* (2013.01)

(58) Field of Classification Search
CPC .......................... G06F 11/1076; H03M 13/154
See application file for complete search history.

(56) References Cited

U.S. PATENT DOCUMENTS 10,120,576 B2 11/2018 Manzanares et al.
10,310,765 B1 * 6/2019 Laurence ................ G06F 3/061
2016/0378612 A1 * 12/2016 Hipsh ................. G06F 11/1076 707/647
2017/0093980 A1 3/2017 Colgrove et al.
2019/0012466 A1 1/2019 Ricotta et al.
2019/0171537 A1 6/2019 Wang et al.

FOREIGN PATENT DOCUMENTS

KR 1020180119888 A 11/2018

OTHER PUBLICATIONS

International Search Report and Written Opinions of Application No. PCT/US2020/025186, dated Jul. 24, 2020 (10 pages).
Christopher, B2 Resiliency, Durability and Availability, Zendesk Helpdesk, Jul. 17, 2018, p. 1-2, https://help.backblaze.com/hc/en-us/articles/218485257-B2-Resiliency-Durability-and-Availability.
Fisk, Nick, Mastering Ceph, Redefine your storage system, Packt, May 2017, p. 1-604, Packt Publishing Ltd., Birmingham, UK.
Fisk, Nick, What is Erasure coding, Packt Hub Article, Jun. 7, 2012, p. 1-10, https://hub.packtpub.com/erasure-coding-cold-storage/.

* cited by examiner

*Primary Examiner* — Thien Nguyen
(74) *Attorney, Agent, or Firm* — Patent Law Works LLP

(57) ABSTRACT

Example storage systems, storage nodes, and methods provide erasure coding of data shards containing multiple data objects. Storage nodes store data shards having a data shard size and each containing a plurality of data objects, where the sum of the data object sizes is less than the data shard size. Some storage nodes store a parity shard containing parity data for the other data shards.

20 Claims, 11 Drawing Sheets

ERASURE CODED DATA SHARDS CONTAINING MULTIPLE DATA OBJECTS

TECHNICAL FIELD

The present disclosure generally relates to data storage, and in a more particular example, to erasure coding data shards across storage nodes.

BACKGROUND

Often, distributed storage systems are used to store large amounts (e.g., terabytes, petabytes, exabytes, etc.) of data, such as objects or files in a distributed and fault tolerant manner with a predetermined level of redundancy.

Some existing object storage systems store data objects referenced by an object identifier versus file systems. This can generally allow object storage systems to surpass the maximum limits for storage capacity of file systems in a flexible way such that, for example, storage capacity can be added or removed as a function of the applications, systems, and/or enterprise needs, while reducing degradation in performance as the system grows. As a result, object storage systems are often selected for large-scale storage systems.

These large-scale storage systems may support the storage of data that is erasure coded and distributed across many storage devices. Data, such as files or objects, may be split into messages, shards, or similar data units which have an upper bound in size. These data units are then split up into a number of symbols. The symbols are then used as input for erasure coding. For example, when using a systematic erasure coding algorithm, the output of the erasure coding process yields the original symbols and a fixed number of additional parity symbols. The sum of these symbols are distributed among a selection of storage devices.

In many configurations, each data object may be distributed in small pieces across a number of storage nodes. While this may improve data reliability, it may cause object writes and reads to generate operation on many nodes. In systems with a large number of small objects, this approach may create more low-level reads and writes per object transaction and increase network bandwidth due to back end data forwarding between object stores. Some systems may accumulate small objects in a buffer, then treat the entire buffer as an "object" for erasure coding purposes. But additional efficiencies may be desired for managing small objects.

A need exists for at least storage systems that manage erasure coding of small objects with reduced data transfers and improved efficiency and reliability.

SUMMARY

Various aspects for erasure coding by storage systems, particularly, erasure coded shards containing multiple data objects in the storage nodes are described.

One general aspect includes a system that includes a first storage node in a plurality of storage nodes, a second storage node in the plurality of storage nodes, and a third storage node in the plurality of storage nodes. The first storage node is configured to store a first data shard having a first data shard size. The first data shard is configured to contain a first plurality of data objects. A sum of data object sizes of the first plurality of data objects does not exceed the first data shard size. The second storage node is configured to store a second data shard having a second data shard size. The second data shard is configured to contain a second plurality of data objects. A sum of data object sizes of the second plurality of data objects does not exceed the second data shard size. The third storage node is configured to store a parity shard configured to contain parity data for both the first data shard and the second data shard.

Implementations may include one or more of the following features. The first data shard may be configured to include a first portion of a partial data object and the second data shard may be configured to include a second portion of the partial data object. The parity data may be associated with a redundancy stripe for the first data shard and the second data shard; the first data shard may be configured to include a remainder portion of a partial data object; and a prior redundancy stripe may be configured to include a prior portion of the partial data object. The first data shard size may be different than the second data shard size. The first storage node may include a first shard buffer and be configured to store the first plurality of data objects to the first shard buffer and store a mirrored first data shard to the third storage node. The second storage node may be further configured to store a mirrored second data shard to the third storage node. A plurality of data shards including a redundancy stripe may include the first data shard and the second data shard. The third storage node may be further configured to: determine that the plurality of data shards including the redundancy stripe are complete; and calculate, responsive to determining that the plurality of data shards are complete, the parity shard based on the mirrored first data shard and the mirrored second data shard. The system may further include a distributor configured to: receive a plurality of storage requests for a requested plurality of data objects; execute a distributor function for the requested plurality of data objects to select, for each data object in the requested plurality of data objects, a target storage node from the plurality of storage nodes, where the distributor function is configured to allocate complete data objects to a target data shard for the target storage node until a next data object exceeds a target data shard size; distribute the requested plurality of data objects to the target storage nodes from the plurality of storage nodes, where the requested plurality of data objects includes the first plurality of data objects and the second plurality of data objects. The distributor may be further configured to: determine whether an object size of a new data object exceeds a small object threshold; and partition, responsive to determining that the object size of the new data object exceeds the small object threshold, the new data object into a plurality of data shards distributed across the plurality of storage nodes in a new redundancy stripe. The system may further include a controller node configured to: receive confirmation of mirrored data shards for each data object of the requested plurality of data objects; and confirm, responsive to receiving confirmation of mirrored data shards for each data object, storage to a host system for each data object prior to calculation of at least one parity shard for a redundancy stripe, where a plurality of data shards, including the first data shard and the second data shard, includes the redundancy stripe.

Another general aspect includes a computer-implemented method that includes: storing, in a first data shard in a first storage node, a first plurality of data objects, where the first data shard has a first data shard size and a sum of data object sizes of the first plurality of data objects does not exceed the first data shard size; storing, in a second data shard in a second storage node, a second plurality of data objects, where the second data shard has a second data shard size and a sum of data object sizes of the second plurality of data objects does not exceed the second data shard size; and storing, in a third storage node, a parity shard configured to contain parity data for both the first data shard and the second data shard.

Implementations may include one or more of the following features. The computer-implemented method may further include: dividing a selected data object into a first portion and a second portion; storing, in the first data shard in the first storage node, the first portion of the selected data object; and storing, in the second data shard in the second storage node, the second portion of the selected data object. The computer-implemented method may further include: dividing a selected data object into a prior portion and a remainder portion; storing, among a plurality of storage nodes, a prior redundancy stripe including the prior portion of a selected data object; and storing, in the first data shard in the first storage node, the remainder portion of the selected data object. The first data shard size may be different than the second data shard size. The computer-implemented method may further include: selecting a first shard buffer in the first storage node; storing the first plurality of data objects to the first shard buffer; and storing a mirrored first data shard to the third storage node. The computer-implemented method may further include: selecting a second shard buffer in the second storage node; storing the second plurality of data objects to the second shard buffer; storing a mirrored second data shard to the third storage node; determining that a plurality of data shards including a redundancy stripe are complete, where the plurality of data shards includes the first data shard and the second data shard; and calculating, responsive to determining that the plurality of data shards are complete, the parity shard based on the mirrored first data shard and the mirrored second data shard. The computer-implemented method may further include: receiving a plurality of storage requests for a requested plurality of data objects; selecting, for each data object in the requested plurality of data objects, a target storage node from a plurality of storage nodes using a distributor function, where the distributor function is configured to allocate complete data objects to a target data shard for the target storage node until a next data object exceeds a target data shard size; and distributing the requested plurality of data objects to the target storage nodes from the plurality of storage nodes, where the requested plurality of data objects includes the first plurality of data objects and the second plurality of data objects and the plurality of storage nodes includes the first storage node and the second storage node. The computer-implemented method may further include: determining whether an object size of a new data object exceeds a small object threshold; and partitioning, responsive to determining that the object size of the new data object exceeds the small object threshold, the new data object into a plurality of data shards distributed across the plurality of storage nodes in a new redundancy stripe. The computer-implemented method may further include: mirroring, from a plurality of data shards including a redundancy stripe, each data object of the requested plurality of data objects; confirming, responsive to mirroring each data object of the requested plurality of data objects, storage to a host system for each data object prior to calculation of at least one parity shard for the redundancy stripe; identifying that the plurality of data shards including the redundancy stripe is complete; and calculating, responsive to identifying that the plurality of data shards is complete, at least one parity shard for the redundancy stripe.

Another general aspect includes a system that includes: a plurality of storage nodes including a first storage node, a second storage node, and a third storage node; means for storing, in a first data shard in the first storage node, a first plurality of data objects, where the first data shard has a first data shard size and a sum of data object sizes of the first plurality of data objects does not exceed the first data shard size; means for storing, in a second data shard in the second storage node, a second plurality of data objects, where the second data shard has a second data shard size and a sum of data object sizes of the second plurality of data objects does not exceed the second data shard size; and means for storing, in the third storage node, a parity shard configured to contain parity data for the first data shard and the second data shard.

Implementations may include one or more of the following features. The system may further include: means for dividing a selected data object into a first portion and a second portion; means for storing, in the first data shard in the first storage node, the first portion of the selected data object; and means for storing, in the second data shard in the second storage node, the second portion of the selected data object.

The various embodiments advantageously apply the teachings of distributed storage networks and/or systems to improve the functionality of such computer systems. The various embodiments include operations to overcome or at least reduce the issues in the previous storage networks and/or systems discussed above and, accordingly, are more reliable and/or efficient than other computing networks. That is, the various embodiments disclosed herein include hardware and/or software with functionality to improve the efficient writing and reading of small data objects in an erasure coded storage system. Accordingly, the embodiments disclosed herein provide various improvements to storage networks and/or storage systems.

It should be understood that language used in the present disclosure has been principally selected for readability and instructional purposes, and not to limit the scope of the subject matter disclosed herein.

DETAILED DESCRIPTION

Figure 1:
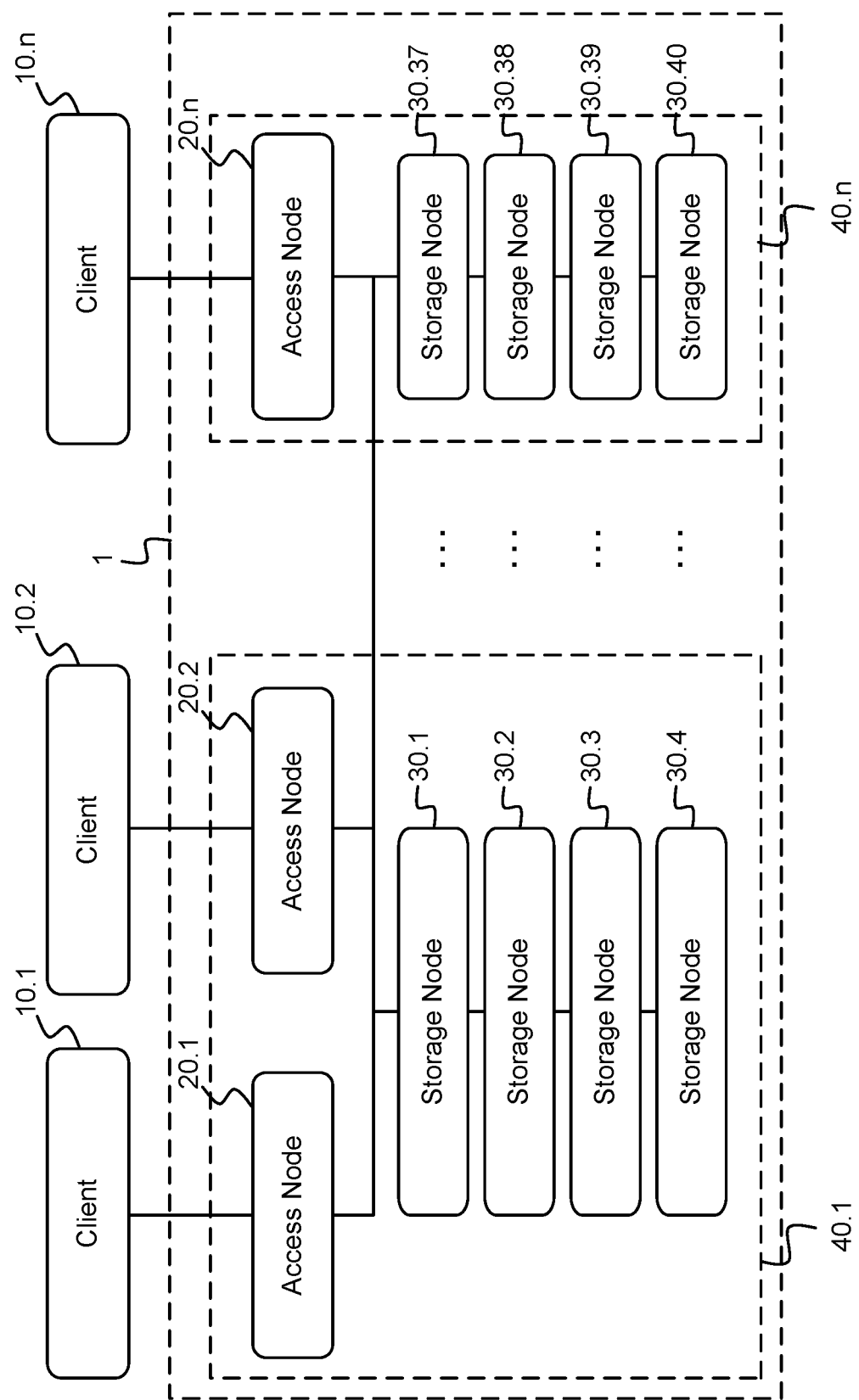
FIG. 1 schematically illustrates an example of a distributed storage system.

FIG. 1 shows an embodiment of an example distributed storage system 1. In some embodiments, the distributed storage system 1 may be implemented as a distributed object storage system which is coupled to one or more clients 10.1-10.n for accessing data objects through one or more controller or access nodes 20.1-10.n. The connection between the distributed storage system 1 and clients 10 could, for example, be implemented as a suitable data communication network. Clients 10 may host or interface with one or more applications that use data stored in distributed storage system 1. Such an application could, for example, be a dedicated software application running on a client computing device, such as a personal computer, a laptop, a wireless telephone, a personal digital assistant or any other type of communication device that is able to interface directly with the distributed storage system 1. However, according to alternative embodiments, the applications could, for example, comprise a suitable file system which enables a general-purpose software application to interface with the distributed storage system 1, an application programming interface (API) library for the distributed storage system 1, etc. In some embodiments, access nodes 20 may include a file interface system for receiving file data requests from clients 10 according to a file system protocol and access data in storage nodes 30.1-30.40 using a different storage protocol, such as an object storage protocol.

As further shown in FIG. 1, the distributed storage system 1 comprises a plurality of controller or access nodes 20 and a plurality of storage nodes 30 which may be coupled in a suitable way for transferring data, for example by means of a conventional data communication network such as a local area network (LAN), a wide area network (WAN), a telephone network, such as the public switched telephone network (PSTN), an intranet, the internet, or any other suitable communication network or combination of communication networks. Access nodes 20, storage nodes 30 and the computing devices comprising clients 10 may connect to the data communication network by means of suitable wired, wireless, optical, etc. network connections or any suitable combination of such network connections. Although the embodiment of FIG. 1 shows only three access nodes 20 and forty storage nodes 30, according to alternative embodiments the distributed storage system 1 could comprise any other suitable number of storage nodes 30 and, for example, two, three or more access nodes 20 coupled to these storage nodes 30.

These access nodes 20 and storage nodes 30 may be built as general-purpose computers. Alternatively, they may be physically adapted for arrangement in large data centers, where they are arranged in modular racks 40.1-40.n comprising standard dimensions. Exemplary access nodes 20 and storage nodes 30 may be dimensioned to take up a single unit of such racks 40, which is generally referred to as 1 U. Such an exemplary storage node may use a low-power processor and may be equipped with ten or twelve high capacity serial advanced technology attachment (SATA) disk drives and is connectable to the network over redundant Ethernet network interfaces. An exemplary access node 20 may comprise high-performance servers and provide network access to clients 10 over multiple high bandwidth Ethernet network interfaces. Data can be transferred between clients 10 and such access nodes 20 by means of a variety of network protocols including hypertext transfer protocol (HTTP)/representational state transfer (REST) object interfaces, language-specific interfaces such as Microsoft .Net, Python or C, etc. Additionally, such access nodes may comprise additional high bandwidth Ethernet ports to interface with the storage nodes 30. In some embodiments, HTTP/REST protocols complying with the Amazon Simple Storage Service (S3) object storage service may enable data transfer through a REST application protocol interfaces (API). Such access nodes 20 may operate as a highly available cluster of controller nodes with one or more integrated and/or independent interface systems, and provide for example shared access to the storage nodes 30, metadata caching, protection of metadata, etc.

As shown in FIG. 1 several storage nodes 30 can be grouped together, for example because they are housed in a single rack 40. For example, storage nodes 30.1-30.4 and 30.37-30.40 each are respectively grouped into racks 40.1 and 40.n. Access nodes 20 may be located in the same or different racks as the storage nodes to which the access nodes connect. A rack may have multiple access nodes, for example rack 40.1, a single access node as rack 40.n, or no access nodes (not shown) and rely on an access node in another rack or storage nodes or clients with built-in access node and/or controller node capabilities. These racks are not required to be located at the same location, they are often geographically dispersed across different data centers, such as for example rack 40.1-40.3 can be located at a data center in Europe, 40.4-40.7 at a data center in the USA and 40.8-40.10 at a data center in China.

Figure 2:
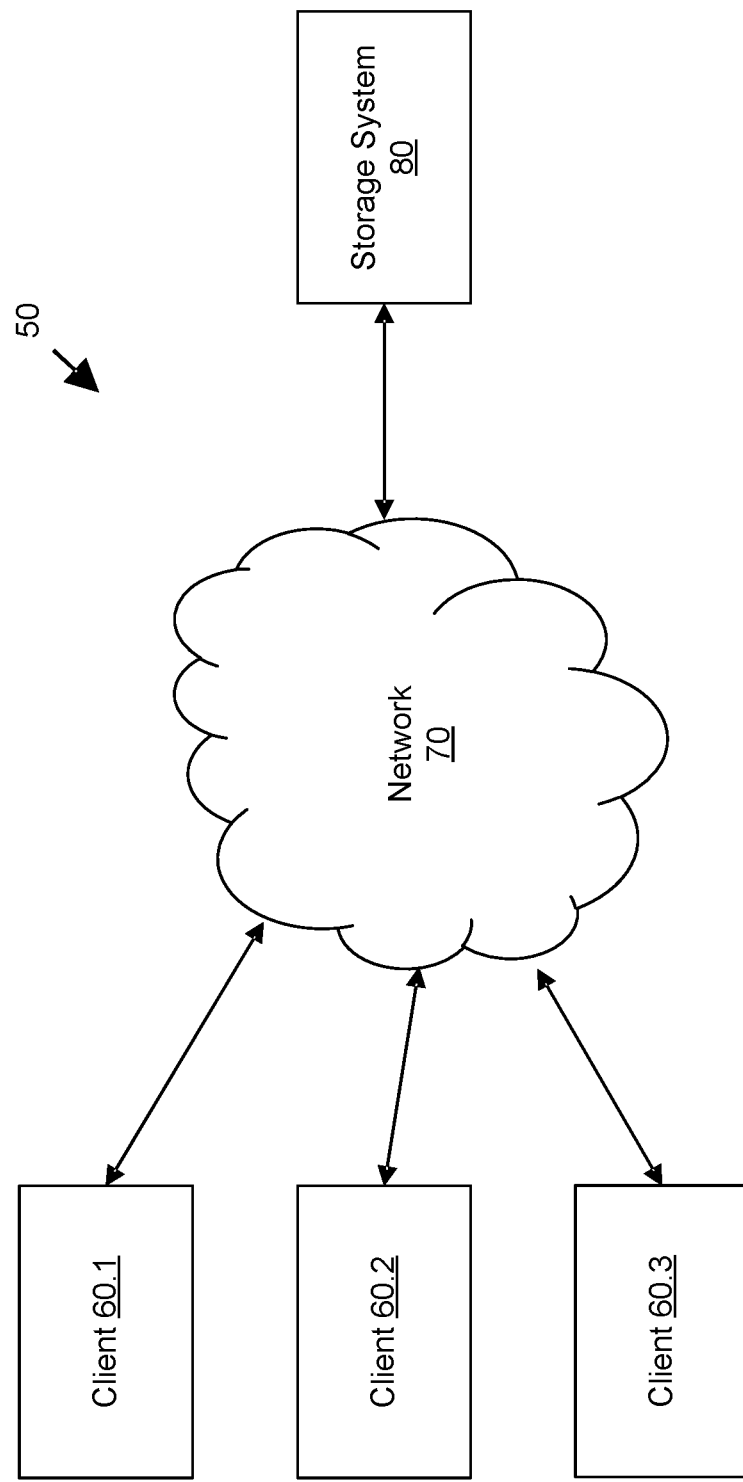
FIG. 2 schematically illustrates an example client architecture in which the distributed storage system of FIG. 1 may operate.

FIG. 2 is a block diagram of an example storage network 50 using a client architecture. In some embodiments, distributed storage system 1 may be embodied in such a storage network 50. As shown, storage network 50 can include multiple client devices 60 capable of being coupled to and in communication with a storage network 50 via a wired and/or wireless network 70 (e.g., public and/or private computer networks in any number and/or configuration (e.g., the Internet, an intranet, a cloud network, etc.)), among other examples that may include one client device 60.1 or two or more client devices 60 (e.g., is not limited to three client devices 60.1-60.3).

A client device 60 can be any computing hardware and/or software (e.g., a thick client, a thin client, or hybrid thereof) capable of accessing storage system 80 utilizing network 70. Each client device 60, as part of its respective operation, relies on sending input/output (I/O) requests to storage system 80 to write data, read data, and/or modify data. Specifically, each client device 60 can transmit I/O requests to read, write, store, communicate, propagate, and/or transport instructions, data, computer programs, software, code, routines, etc., to storage system 80. Client device(s) 60 and storage system 80 may comprise at least a portion of a client-server model. In general, storage system 80 can be accessed by client device(s) 60 and/or communication with storage system 80 can be initiated by client device(s) 60 through a network socket (not shown) utilizing one or more inter-process networking techniques. In some embodiments, client devices 60 may access one or more applications to use or manage a distributed storage system, such as distributed storage system 1 in FIG. 1.

Figure 3:
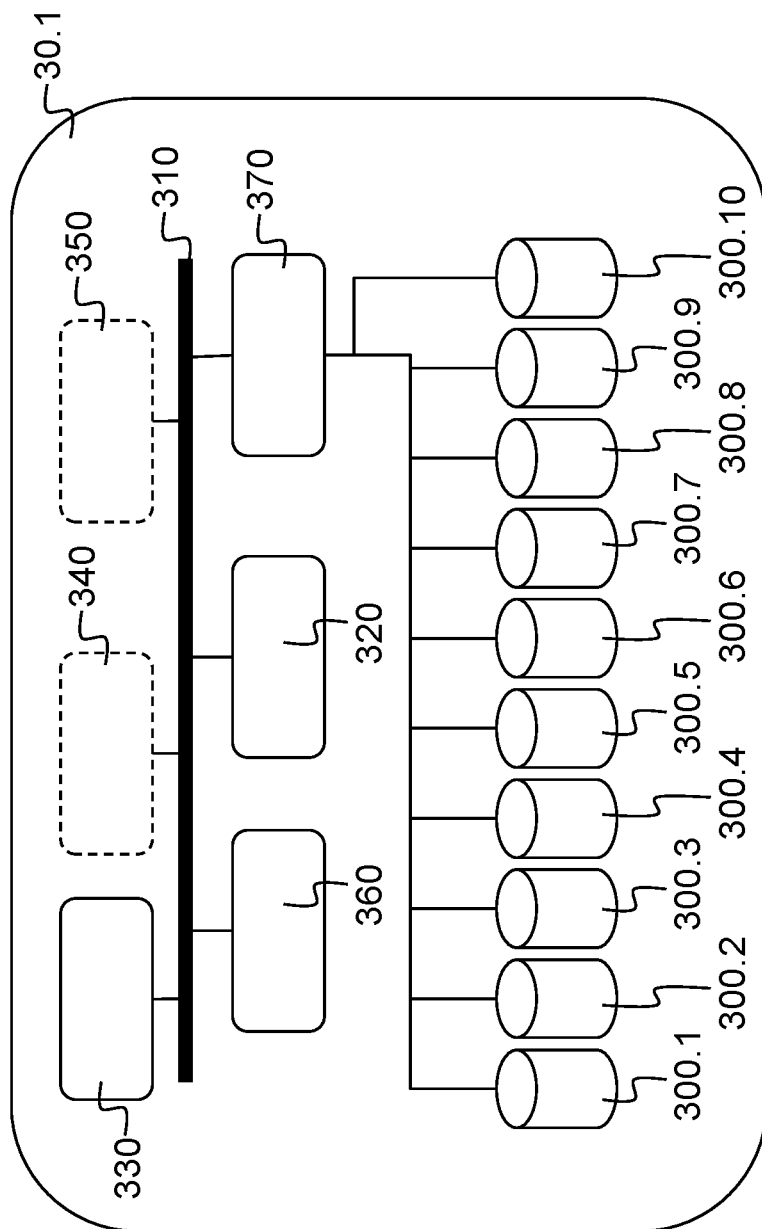
FIG. 3 schematically illustrates an example of a storage node of the distributed storage system of FIG. 1.

FIG. 3 shows a schematic representation of an embodiment of one of the storage nodes 30. Storage node 30.1 may comprise a bus 310, a processor 320, a local memory 330, one or more optional input units 340, one or more optional output units 350, a communication interface 360, a storage element interface 370, and two or more storage elements 300.1-300.10. Bus 310 may include one or more conductors that permit communication among the components of storage node 30.1. Processor 320 may include any type of conventional processor or microprocessor that interprets and executes instructions. Local memory 330 may include a random access memory (RAM) or another type of dynamic storage device that stores information and instructions for execution by processor 320 and/or a read only memory (ROM) or another type of static storage device that stores static information and instructions for use by processor 320. Input unit 340 may include one or more conventional mechanisms that permit an operator to input information to the storage node 30.1, such as a keyboard, a mouse, a pen, voice recognition and/or biometric mechanisms, etc. Output unit 350 may include one or more conventional mechanisms that output information to the operator, such as a display, a printer, a speaker, etc. Communication interface 360 may include any transceiver-like mechanism that enables storage node 30.1 to communicate with other devices and/or systems, for example mechanisms for communicating with other storage nodes 30 or access nodes 20 such as for example two 1 gigabit (Gb) Ethernet interfaces.

Storage element interface 370 may comprise a storage interface such as for example a SATA interface or a small computer system interface (SCSI) for connecting bus 310 to one or more storage elements 300, such as one or more local disks, for example 3 terabyte (TB) SATA disk drives, and control the reading and writing of data to/from these storage elements 300. In one exemplary embodiment as shown in FIG. 2, such a storage node 30.1 could comprise ten or twelve 3 TB SATA disk drives as storage elements 300.1-300.10 and in this way storage node 30.1 would provide a storage capacity of 30 TB or 36 TB to the distributed storage system 1. According to the exemplary embodiment of FIG. 1 and in the event that storage nodes 30.2-30.40 are identical to storage node 30.1 and each comprise a storage capacity of 36 TB, the distributed storage system 1 would then have a total storage capacity of 1440 TB.

As is clear from FIGS. 1 and 3 the distributed storage system 1 comprises a plurality of storage elements 300. As will be described in further detail below, the storage elements 300, could also be referred to as redundant storage elements 300 as the data is stored on these storage elements 300 such that none or a specific portion of the individual storage elements 300 on its own is critical for the functioning of the distributed storage system. Each of the storage nodes 30 may comprise a share of these storage elements 300.

As shown in FIG. 3 storage node 30.1 comprises ten storage elements 300.1-300.10. Other storage nodes 30 in FIG. 1 could comprise a similar amount of storage elements 300, but this is, however, not essential. Storage node 30.2 could, for example, comprise six storage elements 300.11-300.16, and storage node 30.3 could, for example, comprise four storage elements 300.17-300.20. As will be explained in further detail below, the distributed storage system 1 may be operable as a distributed object storage system to store and retrieve a data object comprising data (e.g. 64 megabytes (MB) of binary data) and a data object identifier for addressing this data object, for example, a universally unique identifier such as a globally unique identifier (GUID). Embodiments of the distributed storage system 1 may operate as a distributed object storage system. Storing the data offered for storage by the application in the form of a data object, also referred to as object storage, may have specific advantages over other storage schemes such as block-based storage or file-based storage.

The storage elements 300 or a portion thereof may be redundant and operate independently of one another. This means that if one particular storage element 300 fails its function it can easily be taken on by another storage element 300 in the distributed storage system 1. However, as will be explained in more detail further below, the storage elements 300 are capable of providing redundancy without having to work in synchronism, as is for example the case in many well-known redundant array of independent disks (RAID) configurations, which sometimes even require disc spindle rotation to be synchronized. Furthermore, the independent and redundant operation of the storage elements 300 may allow a suitable mix of types of storage elements 300 to be used in a particular distributed storage system 1. It is possible to use for example storage elements 300 with differing storage capacity, storage elements 300 of differing manufacturers, using different hardware technology such as for example conventional hard disks and solid state storage elements, using different storage interfaces such as for example different revisions of SATA, parallel advanced technology attachment (PATA), and so on. This may result in advantages relating to scalability and flexibility of the distributed storage system 1 as it allows for adding or removing storage elements 300 without imposing specific requirements to their design in correlation to other storage elements 300 already in use in the distributed object storage system.

Figure 4:
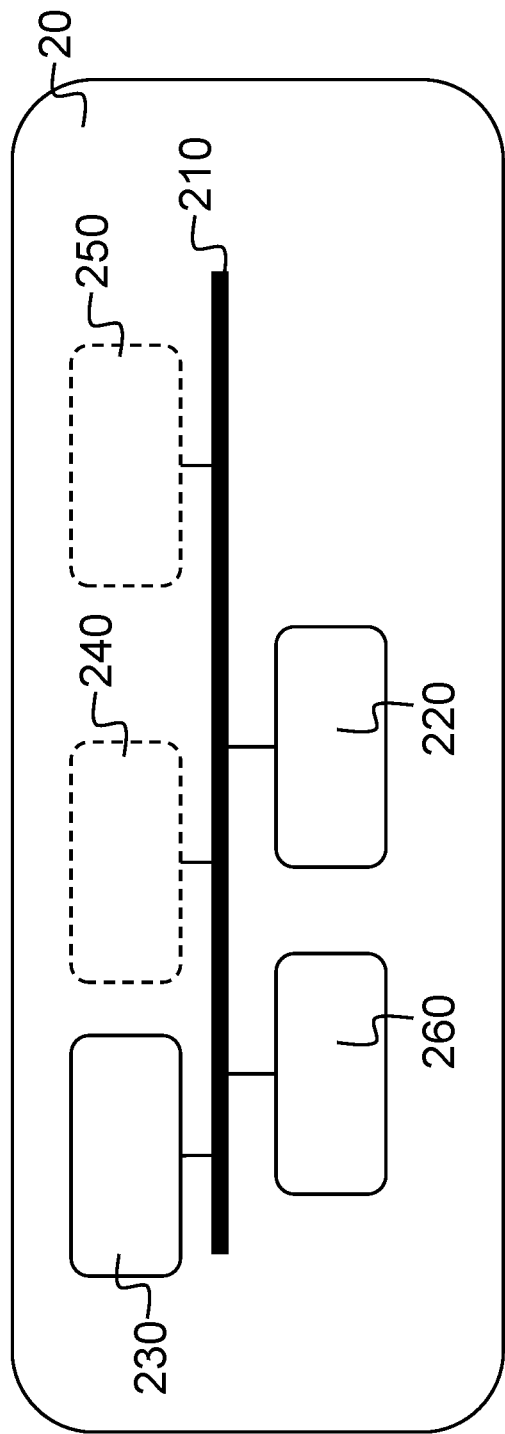
FIG. 4 schematically illustrates an example of a controller node or access node of the distributed storage system of FIG. 1.

FIG. 4 shows a schematic representation of an embodiment of the controller or access node 20. Access node 20 may include storage controller node functions and/or file system interface functions for client systems using file system protocols to access data stored in data objects in storage nodes 30. Access node 20 may comprise a bus 210, a processor 220, a local memory 230, one or more optional input units 240, one or more optional output units 250. In some embodiments, access node 20 may include object storage management functions, including object storage interface functions, version control management, and/or replication engines.

Bus 210 may include one or more conductors that permit communication among the components of access node 20. Processor 220 may include any type of conventional processor or microprocessor that interprets and executes instructions. Local memory 230 may include a random access memory (RAM) or another type of dynamic storage device that stores information and instructions for execution by processor 220 and/or a read only memory (ROM) or another type of static storage device that stores static information and instructions for use by processor 320 and/or any suitable storage element such as a hard disc or a solid state storage element. An optional input unit 240 may include one or more conventional mechanisms that permit an operator to input information to the access node 20 such as a keyboard, a mouse, a pen, voice recognition and/or biometric mechanisms, etc. Optional output unit 250 may include one or more conventional mechanisms that output information to the operator, such as a display, a printer, a speaker, etc. Communication interface 260 may include any transceiver-like mechanism that enables access node 20 to communicate with other devices and/or systems, for example mechanisms for communicating with other storage nodes 30 or access nodes 20 such as for example two 10 Gb Ethernet interfaces.

According to an alternative embodiment, the access node 20 could have an identical design as a storage node 30, or according to still a further alternative embodiment one of the storage nodes 30 of the distributed object storage system could perform both the function of an access node 20 and a storage node 30. According to still further embodiments, the components of the access node 20 as described in more detail below could be distributed amongst a plurality of access nodes 20 and/or storage nodes 30 in any suitable way. According to still a further embodiment, the clients 10 may run an access node 20. According to still further embodiments, access node 20 may be embodied in separate controller nodes and interface nodes with or without redundancy among the controller nodes and/or interface nodes.

Figure 5:
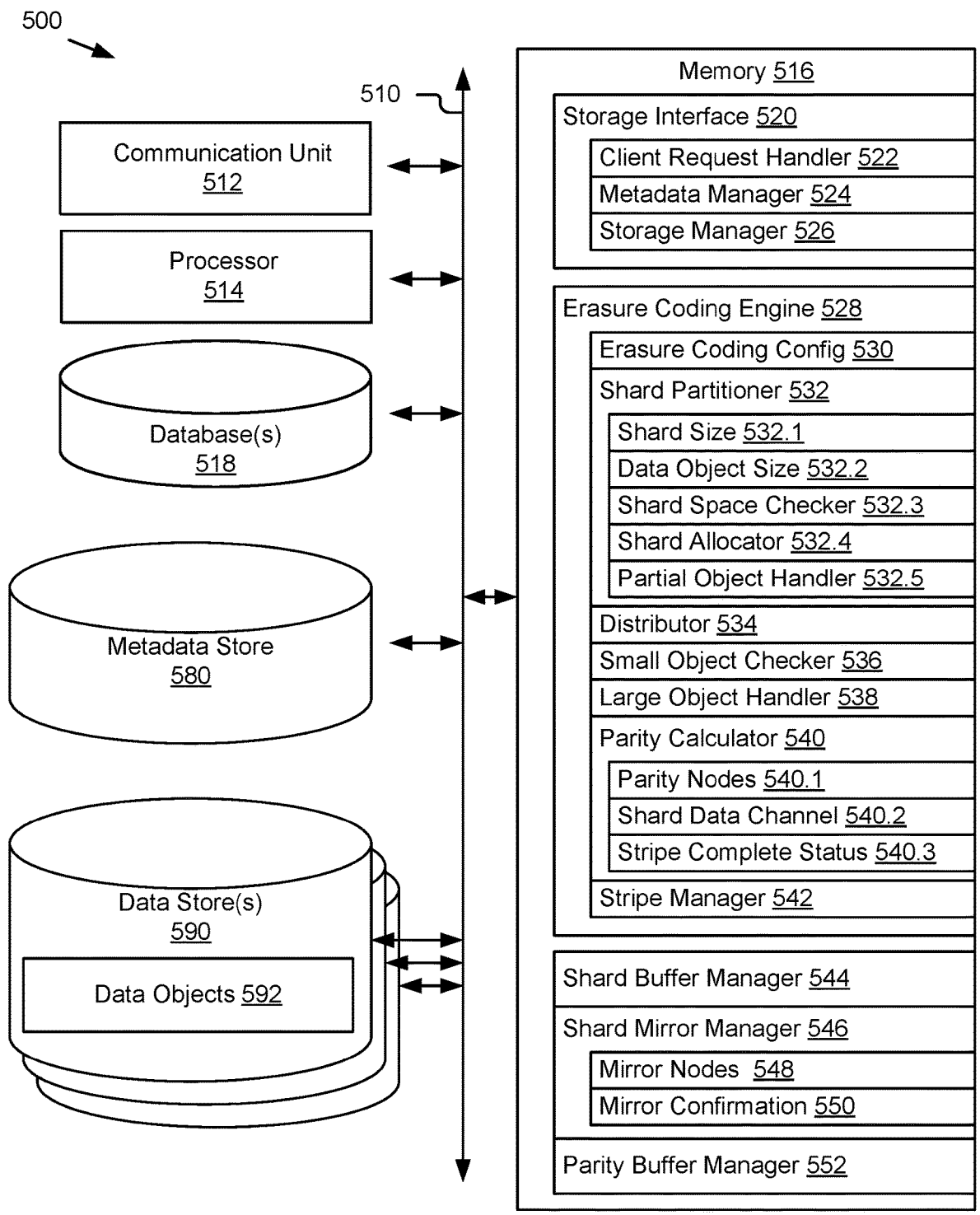
FIG. 5 schematically illustrates some example elements of a storage system for the distributed storage system of FIG. 1.

FIG. 5 schematically shows selected modules of a storage node, controller node, or combination thereof. Storage system 500 may be configured as a node with an architecture and/or hardware similar to controller nodes and/or storage nodes. Storage system 500 may incorporate elements and configurations similar to those shown in FIGS. 1-4. For example, storage system 500 may include one or more controller or access nodes 20 configured with the modules shown. In some embodiments, in addition to the modules hosted by controller node 20, one or more modules of storage system 500, such as storage interface 520, erasure coding engine 528, shard buffer manager 544, shard mirror manager 546, and/or parity buffer manager 552 may be hosted by one or more storage nodes 30, such as the storage nodes containing shard buffers and parity buffers.

Storage system 500 may include a bus 510 interconnecting at least one communication unit 512, at least one processor 514, and at least one memory 516. Bus 510 may include one or more conductors that permit communication among the components of storage system 500. Communication unit 512 may include any transceiver-like mechanism that enables storage system 500 to communicate with other devices and/or systems. For example, communication unit 512 may include wired or wireless mechanisms for communicating with file system clients, other access systems, and/or one or more object storage systems or components, such as storage nodes or controller nodes. Processor 514 may include any type of processor or microprocessor that interprets and executes instructions. Memory 516 may include a random access memory (RAM) or another type of dynamic storage device that stores information and instructions for execution by processor 514 and/or a read only memory (ROM) or another type of static storage device that stores static information and instructions for use by processor 514 and/or any suitable storage element such as a hard disc or a solid state storage element.

Storage system 500 may include or have access to one or more databases and/or specialized data stores, such metadata store 580 and data store(s) 590. Databases may include one or more data structures for storing, retrieving, indexing, searching, filtering, etc. of structured and/or unstructured data elements. In some embodiments, metadata store 580 may be structured as reference data entries and/or data fields indexed by metadata key value entries related to data objects stored in data store(s) 590. Data store(s) 590 may include data objects comprised of object data (such as host data), some amount of metadata (stored as metadata tags), and a GUID. In some embodiments, data store(s) 590 may support one or more key spaces, such as buckets or other logical groupings, that may enable further allocation and management of storage space and data objects. For example, buckets may enable different groups of data objects to be assigned to specific users, storage configurations, etc. and managed with unique key spaces that do not impact other buckets. Metadata store 580, data store(s) 590, and/or other databases or data structures may be maintained and managed in separate computing systems, such as storage nodes, controller nodes, or access nodes, with separate communication, processor, memory, and other computing resources and accessed by storage system 500 through data access protocols. Metadata store 580 and data store(s) 590 may be shared across multiple storage systems 500.

Storage system 500 may include a plurality of modules or subsystems that are stored and/or instantiated in memory 516 for execution by processor 514. For example, memory 516 may include a storage interface 520 configured to receive, process, and respond to data requests and/or data operation or function commands from client systems or other nodes in distributed storage system 1. Memory 516 may include an erasure coding engine 528 for encoding and decoding data shards corresponding to data objects stored in data store(s) 590. Memory 516 may include a shard buffer manager 544 for managing the data stored to shard buffers in each storage node. Memory 516 may include a shard mirror manager 546 for managing the mirroring of shard buffer contents from one storage node to another storage node. Memory 516 may include a parity buffer manager for managing the parity data stored in parity buffers before being written to the storage media in storage nodes acting as parity nodes. In some embodiments, erasure coding engine 528, shard buffer manager 544, shard mirror manager 546, and/or parity buffer manager 552 may be integrated into storage interface 520 and/or managed as separate libraries or background processes (e.g. daemon) through an API or other interface.

Storage interface 520 may include an interface protocol or set of functions and parameters for storing, reading, and otherwise managing data requests to data store 590. For example, storage interface 520 may include functions for reading, writing, modifying, or otherwise manipulating data objects and/or files, as well as their respective client or host data and metadata in accordance with the protocols of an object or file storage system.

In some embodiments, storage interface 520 may include a plurality of hardware and/or software modules configured to use processor 514 and memory 516 to handle or manage defined operations of storage interface 520. For example, storage interface 520 may include a client request handler 522, a metadata manager 524, and a storage manager 526. For any given client request, storage interface 520 may receive a client request through client request handler 522 and determine one or more operations based on the content of the request. These operations may include metadata operations handled by metadata manager 524 and/or object data operations handled by storage manager 526, including erasure coding operations. In some embodiments, data processing operations may be handled by storage interface 520 by calling one or more other modules, erasure coding engine 528, shard buffer manager 544, shard mirror manager 546, and/or parity buffer manager 552. The results of these operations may be processed, formatted, and returned by client request handler 522.

Client request handler 522 may include an interface and/or communication event-based condition for receiving data requests and/or operational commands from one or more clients. For example, client systems may send an object data request over a network connection and addressed to storage system 500 or a port or component thereof. Client request handler 522 may receive these requests and parse them according to the appropriate communication and storage protocols. For example, client request handler 522 may identify a transaction identifier, a client identifier, an object identifier (object name or GUID), a data operation, and additional parameters for the data operation, if any, from the received message or messages that make up the object data request.

Metadata manager 524 may include interfaces, functions, and/or parameters for creating, modifying, deleting, accessing, and/or otherwise managing object or file metadata, such as metadata stored in metadata store 580. For example, when a new object is written to data store 590, at least one new metadata entry may be created in metadata store 580 to represent parameters describing or related to the newly created object. Metadata manager 524 may generate and maintain metadata that enables metadata manager 524 to locate object or file metadata within metadata store 580. For example, metadata store 580 may be organized as a key-value store and object metadata may include key values for data objects and/or operations related to those objects that are indexed with a key value that include the object identifier or GUID for each object. In some embodiments, metadata manager 524 may also manage metadata stored in data store 590 with the data objects or files, such as metadata tags or headers. Metadata manager 524 may work in conjunction with storage manager 526 to create, modify, delete, access or otherwise manage metadata stored as tags or headers within data store 590.

Storage manager 526 may include interfaces, functions, and/or parameters for reading, writing, and deleting data elements in data store 590. For example, object PUT commands may be configured to write object identifiers, object data, and/or object tags to an object store. Object GET commands may be configured to read data from an object store. Object DELETE commands may be configured to delete data from object store, or at least mark a data object for deletion until a future garbage collection or similar operation actually deletes the data or reallocates the physical storage location to another purpose.

In some embodiments, storage manager 526 may oversee writing and reading data elements that are erasure encoded on the storage medium on which data store 590 is stored, such as a plurality of storage nodes. When a message or data unit, such as a file or data object, is received for storage, storage manager 526 may pass the data object through an erasure encoding engine, such as erasure coding engine 528. Depending on the size of the data object relative to the preferred data shard sizes of the erasure coding engine, data objects may be handled in different ways for configuring symbols and parity data among a number of storage nodes. For example, large data objects may be divided into symbols and the symbols encoded into erasure encoded symbols for storage in data store 590. Small data object may be aggregated into data shards before being committed to symbols and encoded. The resulting symbols may be distributed among a plurality of storage nodes to assist with fault tolerance, efficiency, recovery, and other considerations.

When the data unit is to be accessed or read, storage manager 526 may identify the storage locations for each symbol, such as using a data unit/symbol map stored in metadata store 580. Erasure encoded symbols may be passed through an erasure decoding engine, such as encoding/decoding engine available to erasure coding engine 528 and/or storage manager 526, to return the original symbols that made up the data unit to storage manager 526. The data unit can then be reassembled and used by storage manager 526 and other subsystems of storage interface 520 to complete the data access operation. Storage manager 526 may work in conjunction with metadata manager 524 for managing metadata, such as storage locations, versioning information, operation logs, etc. Storage manager 526 may work with erasure coding engine 528 for storing and retrieving erasure encoded symbols in data store 590.

In some embodiments, storage interface 520 may support metadata store 580 being distributed across multiple systems, such as a plurality of access systems. Metadata store 580 and/or portions thereof may be sharded data stores, wherein the data stores are partitioned into segments stored in different computing systems. Storage interface 520 may include the functions for locating and accessing relevant portions of the sharded data base.

Erasure coding engine 528 may include a set of functions and parameters for storing, reading, and otherwise managing encoded data, such as erasure encoded symbols, in data store 590. For example, erasure coding engine 528 may include functions for aggregating user data objects in data shard buffers, encoding a user data symbol including a plurality of data objects into an erasure encoded data symbol, and decoding an erasure encoded data symbol back into the original user data symbol and corresponding data objects. In some embodiments, erasure encoding engine 528 may be included in the write path and/or read path for data store 590 that is managed by storage manager 526. In some embodiments, erasure coding engine 528 may manage erasure coding in redundancy stripes comprised of data shards and parity shards for a set of symbols corresponding to a set of data object storage requests. In some embodiments, the encoding and decoding functions may be placed in separate encoding engines and decoding engines with redundant and/or shared functions where similar functions are used by both encoding and decoding operations.

In some embodiments, erasure coding engine 528 may include a plurality of hardware and/or software modules configured to use processor 514 and memory 516 to handle or manage defined operations of erasure coding engine 528. For example, erasure coding engine 528 may include an erasure coding configuration 530, a shard partitioner 532, distributor 534, small object checker 536, large object handler 538, parity calculator 540, and stripe manager 542.

Erasure coding configuration 530 may include functions, parameters, and/or logic for determining the operations used to partition data units into symbols, encode, and decode those symbols. For example, various erasure coding algorithms exist for providing forward error correction based on transforming a message of a certain number of symbols into a longer message of more symbols such that the original message can be recovered from a subset of the encoded symbols. In some embodiments, a message may be split into a fixed number of symbols and these symbols are used as input for erasure coding. A systematic erasure coding algorithm may yield the original symbols and a fixed number of additional parity symbols. The original symbols may be referred to as data shards and the parity symbols may be referred to as parity shards. The sum of these symbols may then be stored across a plurality of storage locations, such as a series of nodes. A group of original symbols that are processed together to generate corresponding parity symbols may be referred to as a stripe and may be divided across a corresponding number of storage nodes. The storage nodes that the group of original symbols and parity symbols are stored to may be referred to as a placement group.

In some embodiments, original symbols or data shards may have a fixed shard size determined by erasure coding configuration 530 that corresponds to a desired encoded block size. In some embodiments, original symbols or data shards may have a variable shard size and erasure coding configuration 530 may compensate for the variations in symbol size when defining encoded block sizes. In some embodiments, the encoded block size may be selected to align with storage media considerations, such as an erase block size for solid state drives (SSDs), and/or a symbol size that aligns with physical or virtual buffer sizes, such as shard buffers and/or parity buffers. In some embodiments, erasure coding configuration 530 may include a specific coding algorithm supported by storage system 500. For example, coding algorithms may include an algorithm type, such as parity-based, low-density parity-check codes, Reed-Solomon codes, etc., and one or more algorithm parameters, such as number of original symbols, number of encoded symbols, code rate, reception efficiency, etc.

Shard partitioner 532 may include functions, parameters, and/or logic for receiving a plurality of data objects for encoding and partitioning the data objects into a series of original symbols in data shard buffers. In some embodiments, shard partitioner 532 may operate in conjunction with distributor 534, small object checker 536, and/or large object handler 538 to determine how a given data object or series of data objects may be partitioned and/or allocated into the shard buffers. For example, a small data object partitioning operation may receive a series of small data objects relative to a preferred symbol or encoded block size and use a symbol size defined by erasure coding configuration 530 to allocate data objects to each symbol until the symbol size is reached. In some embodiments, shard partitioner 532 may include a shard size value 532.1 and receive or determine a data object size value 532.2 for each data object. For example, shard size value 532.1 may be set in erasure coding configuration 530, determined by shard buffer size, and/or defined to include an acceptable range and increments. Data object size value 532.2 may be included in the parameters of storage requests and/or retrievable from metadata store 580 based on parameters of the storage requests, such as GUID.

In some embodiments, shard partitioner 532 may include a shard space checker 432.3 that monitors the sum of data object sizes that have been allocated to particular shards and determines whether a next data object will fit within the shard size. For example, shard space checker 432.3 may maintain an aggregate value of data object sizes allocated to a particular shard buffer to determine the amount of remaining space in that shard buffer and compare the remaining space value to the size of a particular data object to determine whether to add it to that shard buffer. In some embodiments, shard space checker 432.3 may maintain the sum of data object sizes in a plurality of data shards, such as a set of data shards corresponding to a redundancy stripe or a set of available shard buffers (which may or may not correspond to the number of original symbols per stripe in erasure coding configuration 530). For example, an array of aggregate data object size values may be maintained for a plurality of data shards, where they are set to zero when cleared and then each data object size is added as that object is allocated to the data shard.

A shard allocator 532.4 in shard partitioner 532 may include logic for determining which data shard receives a particular data object. For example, as each data object is received by erasure coding engine 528 and shard space checker 432.3 determines whether the data object will fit in the space remaining in a data shard, shard allocator 532.4 may allocate the data object to a data shard that has adequate space or use partial object handler 532.5 to partition the data object into data object portions that will fit.

In some embodiments, shard allocator 532.4 may operate serially on a group of data shards to fill each in sequence. Shard allocator 532.4 may allocate each incoming data object until a data shard is full before allocating anything to the next data shard. For example, shard allocator 532.4 may allocate three complete data object to a shard before shard space checker 432.3 indicates that there is insufficient space for the next data object. Shard allocator 532.4 may be configured to determine that the current shard is full (such as where data objects are of fixed size and an even multiple of shard size or an acceptable range for variable shard size is reached), pad the remaining portion between the last data object and the shard size, or use partial object handler 532.5 to generate an object portion that will fill the remaining space.

In some embodiments, shard allocator 532.4 may operate on a group of data shards to allocate a group of object using logic to determine how data objects are allocated across the data shards. For example, shard allocator 532.4 may include logic for comparing the combinations of object sizes to maximize the number of complete data objects and/or minimize the number of data objects that are divided into partial data objects. In some embodiments, erasure coding configuration 530 may include selections for small object allocation across shards and whether they are handled serially or in groups, allocation priorities, and/or whether partial objects are supported and how many portions small object may be partitioned into.

Partial object handler 532.5 may include logic for dividing data objects into two or more object portions in order to fit data objects within available space in two or more data shards. For example, using serial allocation, partial object handler 532.5 may use the space remaining a current data shard to select a corresponding size value for the first portion of the data object. The remaining portion of the data object may be allocated to the next data shard. Using group allocation, the data object may be allocated in a similar way, but the logic of shard allocator 532.4 may determine how many portions and their sizes to be allocated among any number of the available data shards (within whatever limits are placed on partial objects).

In some embodiments, distributor 534 may include functions, parameters, and/or logic for distributing the data objects among a plurality of data store(s) 590. For example, distributor 534 may use a hash function or other distributor function based on keys to allocate data objects to data shards in accordance with allocation assignments generated by shard allocator 532.4. In some embodiments, distributor 534 may operate in conjunction with shard allocator 532.4 to reduce non-uniform distributions that cause data shards to be unevenly distributed among data stores 590.

In some embodiments, small object checker 536 may include functions, parameters, and/or logic for sorting data objects by size for handling by erasure coding engine 528. For example, shard partitioner 532 may be configured for managing a large number of data objects with object sizes equal to or below a small object threshold value. Data objects that exceed the small object threshold may be handled through a distinct erasure coding path, such as large object handler 538.

In some embodiments, large object handler 538 may include functions, parameters, and/or logic for erasure coding large data objects. For example, large object handler 538 may be configured to use one or more erasure coding configurations that treat a single data object as the message for erasure coding and partition that data object into a plurality of symbols for parity calculation and storage. Shard partitioner 532 may enable efficiencies when handling small data objects, while large object handler 538 may provide different efficiencies for handling large data objects. Note that small and large are relative terms and may be based on the native block sizes of storage media used for data stores 590, buffer sizes, data object size distributions for a given system or application, and/or specific encoding schemes.

Parity calculator 540 may include functions, parameters, and/or logic for calculating parity or another erasure coding reference for the data shards in a group for encoding. For example, parity calculator 540 may execute a parity calculation on the data in the data shards using an exclusive or (XOR) engine and store the results to one or more parity shards. In some embodiments, a redundancy group may contain a plurality of storage nodes (K) out of a total number of nodes in the group (N), such that the number of parity nodes equals N−K. Parity calculator 540 may identify or select parity nodes 540.1 for generating and/or receiving and storing parity data based on the allocated data shards.

In some embodiments, parity nodes 540.1 may include mirror buffers for receiving redundant copies of data objects prior to calculation of parity. For example, each parity node may include physical or virtual buffer space sufficient to mirror the contents of each data shard as data objects are allocated to them. In a system with three data shards, each parity node may have an equal number of mirror buffers that receive each data object as it is written to the data shard. In some embodiments, parity calculator 540 may include a shard data channel for receiving data from the data shards for parity calculation. For example, storage nodes or a controller may send completed data shards to shard data channel 540.2 for parity calculation. In some embodiments, shard data channel may include the same physical or virtual buffer or storage space used for mirror buffers such that mirror buffers double as the data buffers for parity calculation. In some embodiments, initiation of parity calculations by parity calculator 540 may be conditioned on receipt of a stripe complete status 540.3, indicating that add data shards in a stripe are complete or closed and ready for parity calculation.

Stripe manager 542 may include functions, parameters, and/or logic for identifying redundant stripes and managing their completion status. For example, stripe manager 542 may identify when a placement group is available, the open or closed status of each data shard in the placement group, when stripe complete status is achieved, and when parity complete status is achieved. Stripe manager 542 may use status messages and/or access metadata store 580 to identify stripes, data shards, parity shards, data object locations, and status information. In some embodiments, stripe manager 542 may support shard partitioner 532 and partial object handler 532.5 in allocating partial objects in data shards across redundancy stripes if erasure coding configuration 530 supports it.

Shard buffer manager 544 may include a set of functions and parameters for managing shard buffers, such as shard buffers in the storage nodes to receive the data objects to fill data shards. For example, each storage node may include at least one data shard buffer for aggregating user data objects and a corresponding device manager. Shard buffer manager 544 may include functions for clearing the buffer, opening the buffer for data shard allocation, incrementally adding data objects as they are allocated by erasure coding engine 528, closing the buffer for data shard allocation when it is full, and transferring the contents of the data shard in the buffer to permanent storage on non-volatile storage media, to mirror buffers in other nodes, and/or to a parity node or parity calculator 540 for further processing. In some embodiments, data shard buffers are physical buffers with a hardware buffer size, though data shard sizes may be configured to be smaller than the hardware buffer size. In some embodiments, data shard buffers may be virtual buffers allocated in a larger buffer memory or another memory or storage device. In some embodiments, shard buffer manager 544 is instantiated in each storage node.

Shard mirror manager 546 may include a set of functions and parameters for managing mirrored data shards, such as receiving data shards or data object for data shards for redundant storage until parity can be calculated. For example, each parity node may include at least one data mirror buffer for aggregating user data objects. In some embodiments, a portion of a parity buffer in each parity node may be allocated as a series of mirror buffers for receiving copies of user data objects stored to the storage nodes in their placement group. Shard mirror manager 546 may include functions for clearing the buffer, allocating buffer space for each data shard mirror, opening the buffer for receiving data objects, receiving a copy of a closed data shard or incrementally receiving data objects as they are added to corresponding data shards, closing the buffer when it is full, and transferring the contents of the data shard to parity calculator 540 when a stripe is complete. In some embodiments, shard mirror manager 548 may maintain a map of mirror nodes to identify which mirror buffers correspond to which data shard buffers in the placement group. For example, shard mirror manager 546 may maintain a data structure identifying the corresponding storage nodes and data shard buffer address to the parity nodes and mirror buffer addresses.

In some embodiments, shard mirror manager 546 may provide a mirror confirmation 550 to other system components when a data object and/or data shard are successfully mirrored. For example, as each data object or data shard are stored in a shard buffer, a response status message may be provided to erasure coding engine 528 and/or storage interface 520 to confirm that a desired level of redundancy has been achieved prior to calculating parity. In some embodiments, mirror confirmation 550 may also be used to identify when data shard mirrors are ready to be used for parity calculation. In some embodiments, mirror shard buffers are physical buffers with a hardware buffer size, though data shard sizes may be configured to be smaller than the hardware buffer size. In some embodiments, mirror shard buffers may be virtual buffers allocated in a larger buffer memory or another memory or storage device. Mirror shard buffers may be non-volatile memory, such as battery-backed dynamic random access memory (DRAM), magnetic random access memory (MRAM), or any other non-volatile memory technology with sufficient write endurance. In some embodiments, shard mirror manager 546 is instantiated in each parity node.

Parity buffer manager 552 may include a set of functions and parameters for managing parity data shards, such as receiving data shards, calculating parity data, and storing resulting parity shards. For example, each parity node may include at least one parity buffer for use in buffering shard data and calculating parity through a XOR engine or similar function. In some embodiments, in addition to buffer space for parity data, a portion of a parity buffer in each parity node may be allocated as a series of mirror buffers for receiving copies of user data objects stored to the storage nodes in their placement group. Parity buffer manager 552 may include functions for clearing the buffer, allocating buffer space for each parity shard, opening the buffer for receiving parity data from parity calculator 540, closing the buffer when parity calculation is complete, and transferring the contents of the parity shard to a storage medium when complete. In some embodiments, mirror shard buffers are physical buffers with a hardware buffer size, though parity shard sizes may be configured to be smaller than the hardware buffer size. In some embodiments, parity shard buffers may be virtual buffers allocated in a larger buffer memory or another memory or storage device. In some embodiments, shard mirror manager 546 is instantiated in each parity node. In some embodiments, the functions of parity buffer manager 552, shard mirror manager 546, and parity calculator 540 may be instantiated in a parity manager instantiated in each parity node.

Memory 516 may include additional logic and other resources (not shown) for processing data requests, such as modules for generating, queueing, and otherwise managing object or file data requests. Processing of a data request by storage interface 520 may include any number of intermediate steps that yield at least one data request to the distributed storage system.

Figure 6:
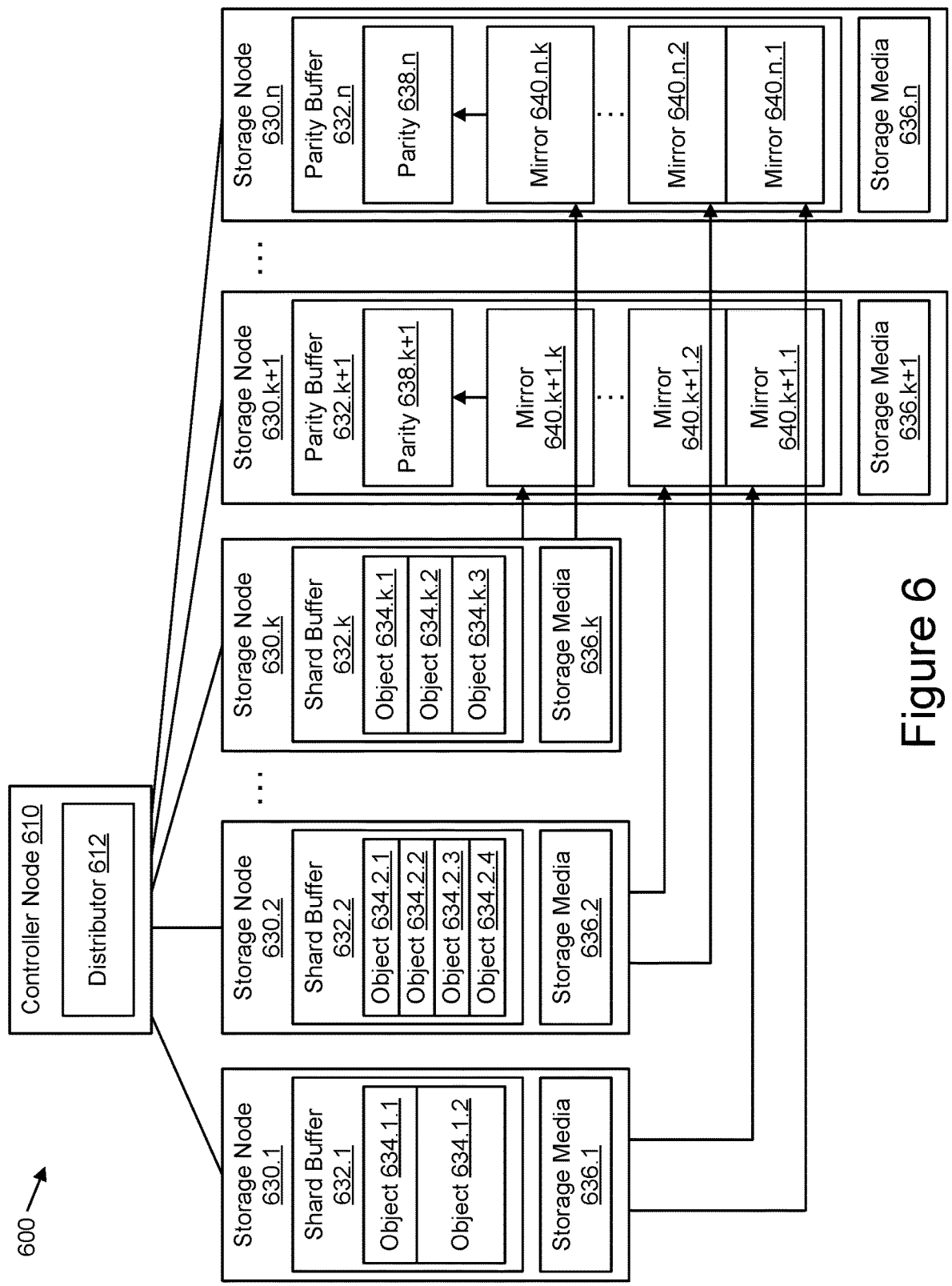
FIG. 6 schematically illustrates an example system distributing data objects across data shards and parity shards in a plurality of storage nodes.

FIG. 6 shows an example distributed storage system 600 configured to group small objects into data shards for storage in a placement group. In some embodiments, distributed storage system 600 may be implemented in a storage system and components similar to those shown and described for FIGS. 1-5 above. Controller node 610 may receive storage requests, parse them into object storage commands with target data objects, and pass them through an erasure coding engine that includes distributor 612. In the erasure coding configuration shown, storage nodes 630.1-630.n form a placement group with storage nodes 630.1-630.k designated as data storage nodes and the remaining storage nodes 630.k+1-630.n designated as parity nodes. Distributor 612 may distribute data objects to storage nodes 630.1-630.k using a distributor function to assign each data object to a storage node.

Storage nodes 630.1-630.k may each include shard buffers 632.1-632.k for aggregating data objects into data shards and storage media 636.1 for storing the data shards once complete. For example, storage node 630.1 may include shard buffer 632.1. Storage node 630.1 may receive data objects 632.1.1 and 634.1.2 for storage and initially aggregate them in shard buffer 632.1 before writing them to permanent storage in storage media 636.1. Storage node 630.2 may include shard buffer 632.2. Storage node 630.2 may receive data objects 632.2.1, 632.2.2, 632.2.3, and 634.2.4 for storage and initially aggregate them in shard buffer 632.2 before writing them to permanent storage in storage media 636.2. Storage node 630.k may include shard buffer 632.k. Storage node 630.k may receive data objects 632.k.1, 634.k.2, and 634.k.3 for storage and initially aggregate them in shard buffer 632.k before writing them to permanent storage in storage media 636.k.

Storage nodes 630.1-630.k may be configured to mirror the contents of their shard buffers 632.1-632.k to storage nodes 630.k+1-630.n, where each parity node will receive a mirror copy of each of shard buffers 632.1-632.k. As described above, this mirroring may occur as each object is received in shard buffers 632.1-632.k or as each shard buffer 632.1-632.k closes due to a complete data shard. In either event, the mirroring may occur before parity is calculated and stored in storage nodes 630.k+1-630.n.

Storage nodes 630.4-630.n may each include parity buffers 632.k+1-632.n for receiving mirror copies of data shards from storage nodes 630.1-630.k and calculating parity data 638.4-638.n. For example, storage node 630.k+1 may be designated as a parity node and include parity buffer 632.k+1. Parity buffer 632.k+1 may be configured to receive mirrored copies of the data shards, such as objects 634.1.1 and 634.1.2 from shard buffer 632.1 in mirror shard 640.k+1.1, objects 632.2.1, 632.2.2, 632.2.3, and 634.2.4 from shard buffer 632.2 in mirror shard 640.k+1.2, and objects 634.k.1, 634.k.2, and 634.k.3 from shard buffer 632.k in mirror shard 640.k+1.k. Storage node 630.n may be designated as a parity node and include parity buffer 632.n. Parity buffer 632.n may be configured to receive mirrored copies of the data shards, such as objects 634.1.1 and 634.1.2 from shard buffer 632.1 in mirror shard 640.n.1, objects 632.2.1, 632.2.2, 632.2.3, and 634.2.4 from shard buffer 632.2 in mirror shard 640.n.2, and objects 634.k.1, 634.k.2, and 634.k.3 from shard buffer 632.k in mirror shard 640.n.k.

Storage nodes 630.4-630.n may be configured to calculate and store parity data 638.k+1-638.n for the data shards in shard buffers 632.1-632.k. For example, the contents of shard buffers 632.1-632.k may be XORed to generate parity data 638.k+1. A similar calculation may result in parity data 638.n. In some embodiments, storage nodes 630.4-630.n may use mirror shards 640.k+1.1-640.k+1.k and 640.n.1-640.n.k as the target data for the calculation of parity data 638.4 and 638.n respectively. Once parity data 638.k+1-638.n are calculated, they may be stored in storage media 636.k+1-636.n respectively and parity buffers 632.k+1-632.n may be used for the next redundancy stripe.

Figure 7:
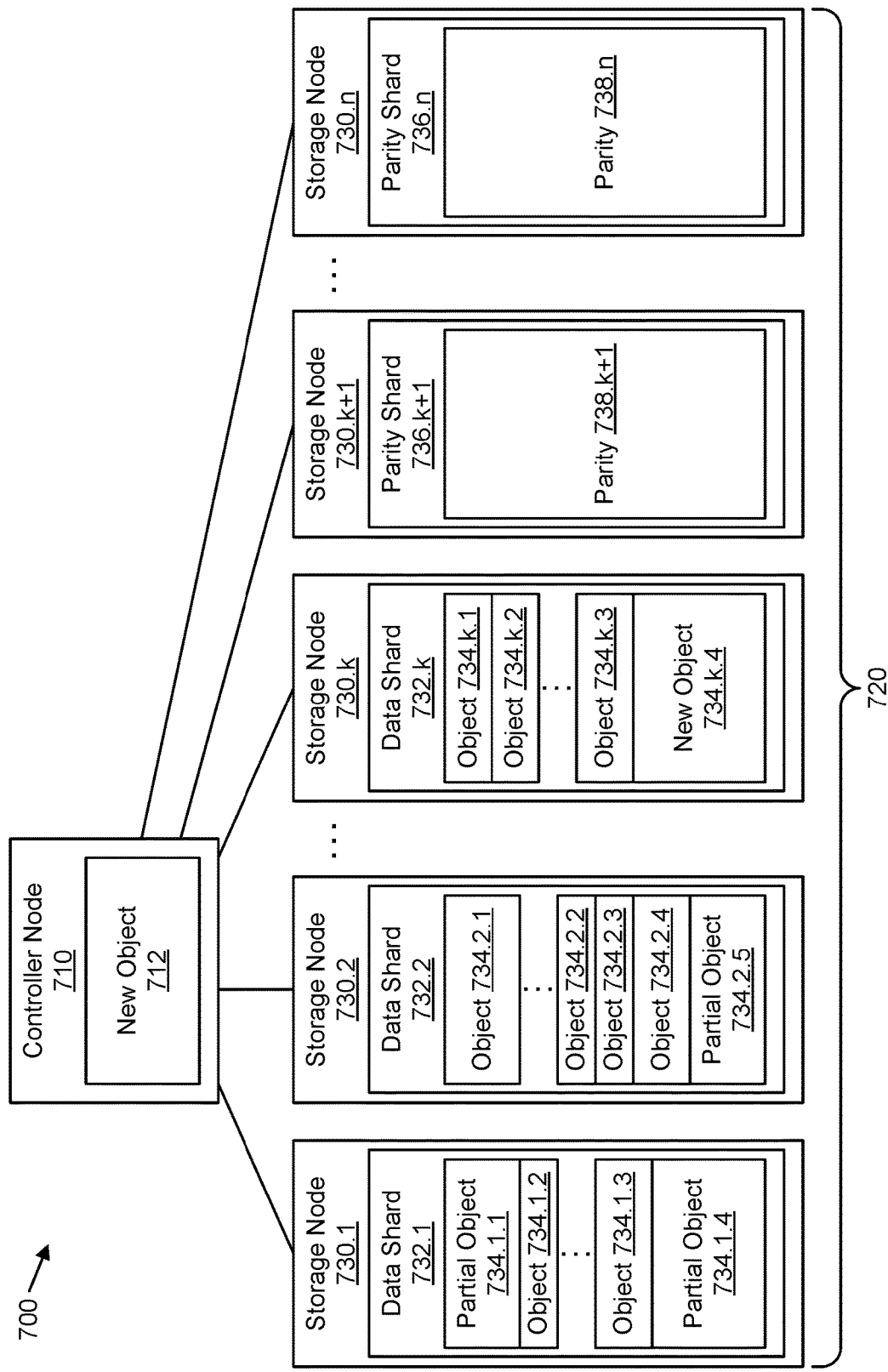
FIG. 7 schematically illustrates another example system distributing data objects across data shards and parity shards in a plurality of storage nodes.

FIG. 7 shows another example distributed storage system 700 configured to group small objects into data shards for storage in placement group 720. In some embodiments, distributed storage system 700 may be implemented in a storage system and components similar to those shown and described for FIGS. 1-6 above. Controller node 710 may receive storage requests, parse them into object storage commands with target data objects, and pass them through an erasure coding engine. For example, controller node 710 may receive a storage request to put new object 712 into permanent storage. In the erasure coding configuration shown, storage nodes 730.1-730.n form placement group 720 with storage nodes 730.1-730.k designated as data storage nodes and the remaining storage nodes 730.k+1-730.n designated as parity nodes.

Storage nodes 730.1-730.k may each contain respective data shards 732.1-732.k. A series of user data objects may have been received by controller node 710 and allocated to data shards 732.1-732.k. For example, data shard 732.1 received a partial object 734.1.1, such as a remainder portion of a prior redundancy stripe where the last object allocated to the stripe would not fit in the remaining space in the data shards. A first portion of the data object may have been written to a data shard in the prior redundancy stripe, leaving the remainder portion to be written as partial object 734.1.1 in data shard 732.1. Partial object 734.1.1 may have been followed by a series of small objects of varying object sizes stored as data objects 734.1.2-734.1.3. But a final data object allocated to data shard 732.1 did not fit in the remaining space after object 734.1.3, so the data object was split into smaller portions based on the amount of space remaining in data shard 732.1. Partial object 734.1.4 may have been stored in data shard 732.1, while the remaining portion may have been stored as partial object 734.2.5 in data shard 732.2. Data shard 732.2 may also have accommodated data objects 734.2.1-734.2.4.

Data shard 732.k may have received data objects 734.k.1-734.k.3 before new object 712 was received by controller node 710. Controller node 710 may have determined that new object 712 will fill the remaining space in data shard 732.k and put new object 712 in to data shard 732.k as new data object 734.k.4. Filling data shard 732.k may close data shard 732.k and complete the corresponding redundancy stripe. Storage nodes 730.4-730.*n* may then receive and/or calculate parity data 738.4-738.*n* based on data shards 732.1-732.*k* and store the data in parity shards 736.4-736.*n*. Once parity shards 736.4-736.*n* are stored, the redundancy stripe is completely stored with the desired erasure coding configuration, redundancy, and resilience to failed storage devices. In some embodiments, one or more reference identifiers between portions of a partial object may be added. For example, a reference pointer from one portion of the data object to the other portion of that data object may be added in a metadata tag or header stored with one or both portions and/or included in a lookup table using an identifier for the data object and/or the shards containing the data object portions.

Figure 8:
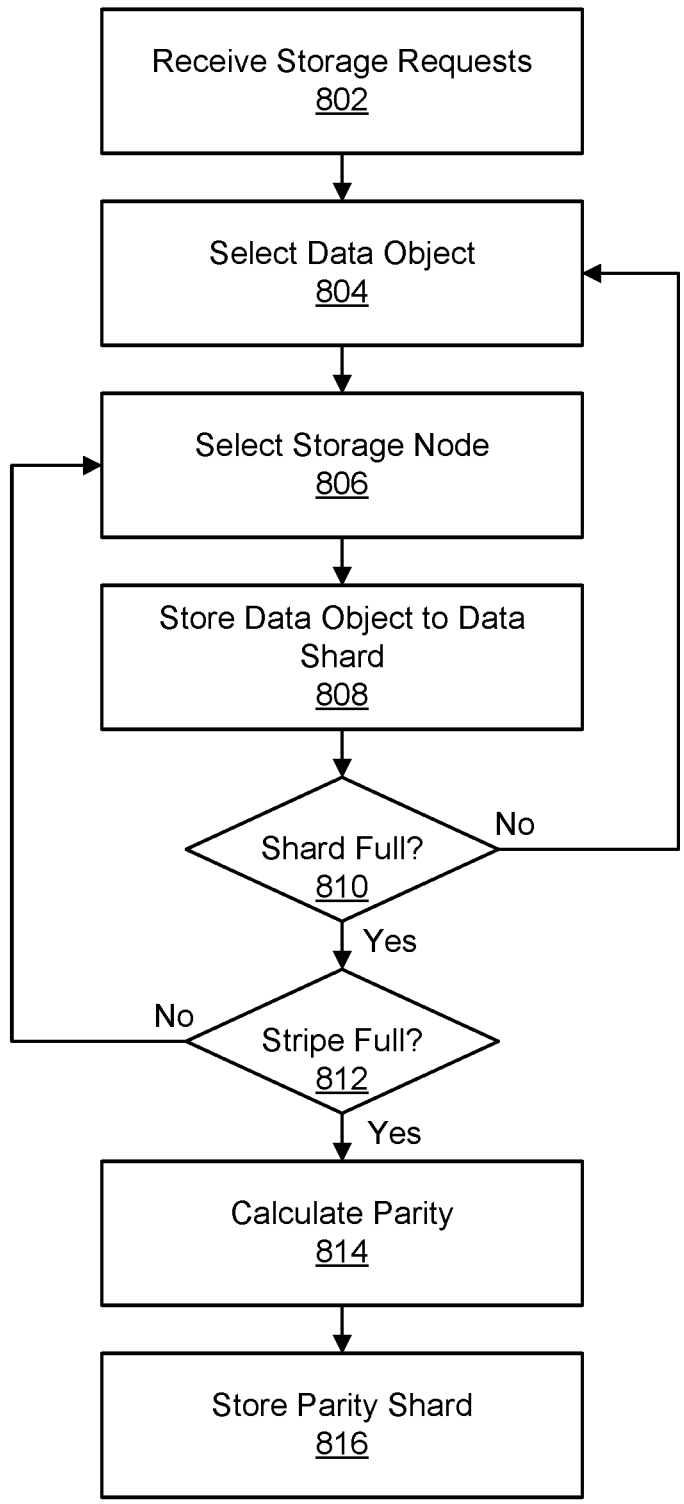
FIG. 8 illustrates an example method of erasure coding data objects.

As shown in FIG. 8, the storage systems shown and described with regard to FIGS. 1-7 may be operated according to an example method of erasure coding data shards containing multiple data objects, i.e. according to the method 800 illustrated by the blocks 802-816 of FIG. 8.

At block 802, one or more storage requests including a plurality of data objects may be received by a storage system. For example, a series of storage requests may be received including put operations for small data objects.

At block 804, a data object may be selected for storage from the data object received. For example, a storage interface may identify a next storage operation in a queue based on the storage requests and select the data object targeted by that storage operation for processing.

At block 806, a storage node is selected to receive the data object for storage. For example, a storage node with an open data shard and remaining space less than the size of the data object may be selected to receive the data object.

At block 808, the data object is stored in a data shard on the target storage node. For example, the data object may be transferred from a controller node to a shard buffer in the target storage node.

At block 810, whether the shard is full may be evaluated. For example, a shard space check may be executed that compares the sum of the sizes of the data objects currently in (or committed to) the data shard to the data shard size. If no, the shard is not yet full and method 800 may return to block 804 to select another data object for processing (and possible storage to the current data shard). If yes, then the shard may be closed and method 800 may proceed to block 812.

At block 812, whether the stripe or group of data shards is full may be evaluated. For example, data shard that received the data object may be one of a set of data shards spread across storage nodes configured to receive a redundancy stripe and an erasure coding engine may track when each data shard in the stripe is full or closed. If not, then the stripe is not yet full and method 800 may return to block 806 to select a storage node that still has an open data shard. If yes, the stripe is full and method 800 may proceed to 814.

At block 814, parity may be calculated for the data shards in the stripe. For example, the data shards may be processed through a parity calculator and the parity data written to a parity shard in a storage node designated as a parity node for the stripe.

At block 816, the parity shard may be stored in the storage medium of the parity node. For example, the parity shard may initially be written to a parity buffer before being transferred to permanent storage and storage of the data object in the redundancy stripe may be complete.

Figure 9:
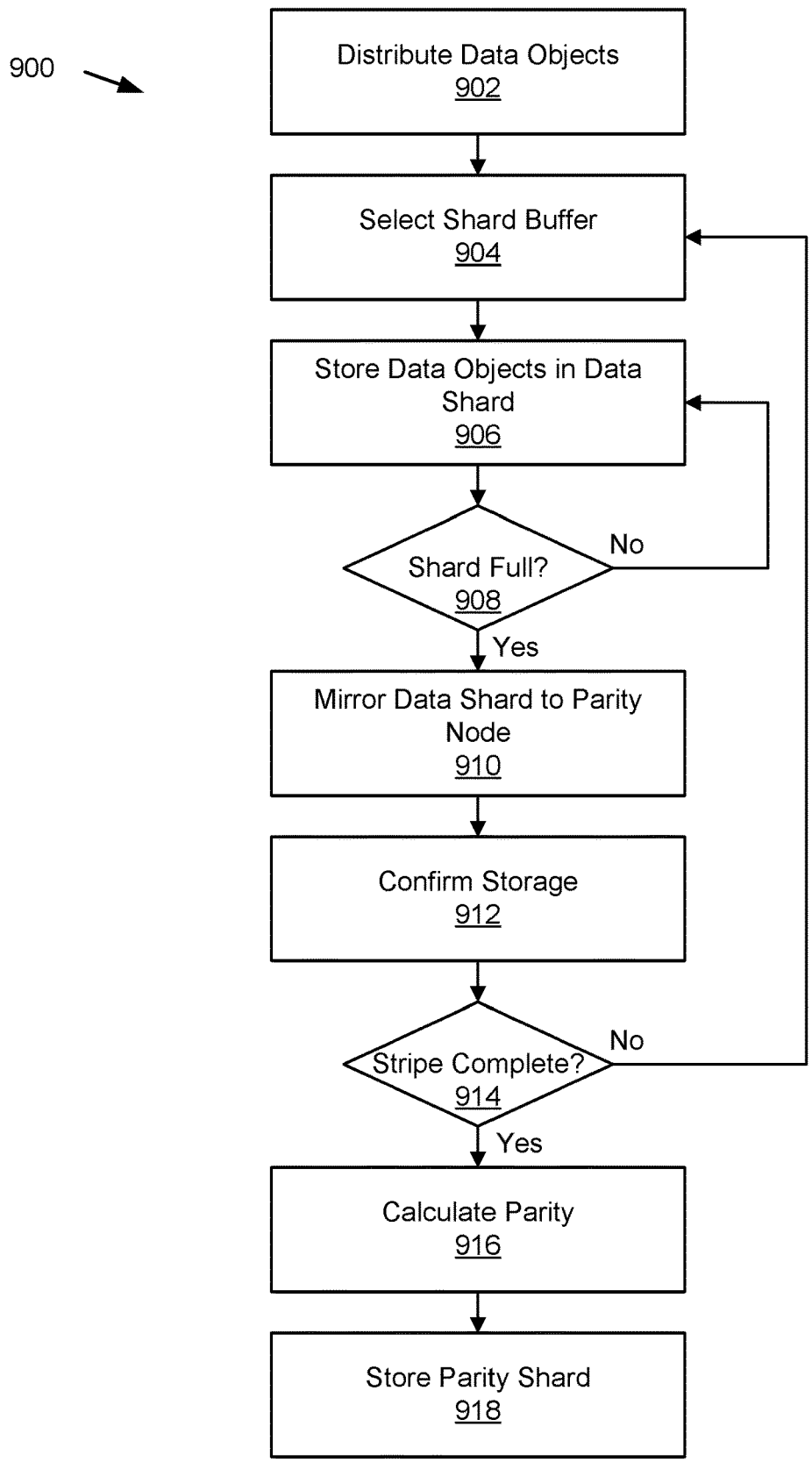
FIG. 9 illustrates an example method of erasure coding data objects with shard mirroring.

As shown in FIG. 9, the storage systems shown and described with regard to FIGS. 1-7 may be operated according to another example method of erasure coding data shards containing multiple data objects, i.e. according to the method 900 illustrated by the blocks 902-918 of FIG. 9.

At block 902, data objects that have been received in one or more storage requests may be distributed across a plurality of storage nodes. For example, storage requests including small data objects may be allocated to a plurality of storage nodes in a placement group using a distributor hash function.

At block 904, a shard buffer is selected to receive data objects for storage. For example, a shard buffer with an open data shard and remaining space less than the size of the data objects may be selected to receive data objects.

At block 906, data objects are stored in a data shard in the shard buffer of a storage node. For example, the data object may be transferred from a controller node to the shard buffer in the target storage node.

At block 908, whether the shard is full may be evaluated. For example, a shard space check may be executed that compares the sum of the sizes of the data objects currently in (or committed to) the data shard to the data shard size. If no, the shard is not yet full and method 900 may return to block 906 to receive additional data objects. If yes, then the shard may be closed and method 900 may proceed to block 910. In some embodiments, there may be conditions for closing a data shard that is not yet full, such as if it is within a certain size threshold and/or elapsed time or other considerations require closing the shard to continue processing and method 900 may also proceed to 910 under these conditions. For example, a shard may be closed and the remaining space in the shard may be padded with placeholder data, such as a string of zeroes. In some embodiments, the pad data may not actually be stored to media.

At block 910, a data shard may be mirrored to the parity node(s). For example, the closed data shard may be transferred to a buffer space in the parity drive to provide both immediate redundancy and be available for parity calculation when the stripe is complete. In some embodiments, individual data objects may be mirrored from the data shard to a mirror shard in the parity node as they are received, rather than waiting for the shard to be full. Note that mirroring at 910 may include mirroring the data shard to generate multiple copies of the mirror shard on different parity nodes.

At block 912, storage of the data objects contained in the data shard may be confirmed to a host system. For example, once redundant copies are stored in the mirror shards of the parity drives, a desired redundancy level may be achieved regardless of whether the remaining data shards in a redundancy stripe have been filled or parity calculation and storage has been completed.

At block 914, whether the stripe or group of data shards is complete may be evaluated. For example, the closed data shard may be one of a set of data shards spread across storage nodes configured to receive a redundancy stripe and an erasure coding engine may track when each data shard in the stripe is full or closed. If not, then the stripe is not yet full and method 900 may return to block 904 to select another shard buffer with an open data shard to receive data objects. If yes, the stripe is full and method 900 may proceed to 916.

At block 916, parity may be calculated for the data shards in the stripe. For example, the mirror shards may be processed through a parity calculator and the parity data written to the parity shard in the same storage node.

At block 918, the parity shard may be stored in the storage medium of the parity node. For example, the parity shard may initially be written to a parity buffer before being transferred to permanent storage and storage of the data object in the redundancy stripe may be complete.

Figure 10:
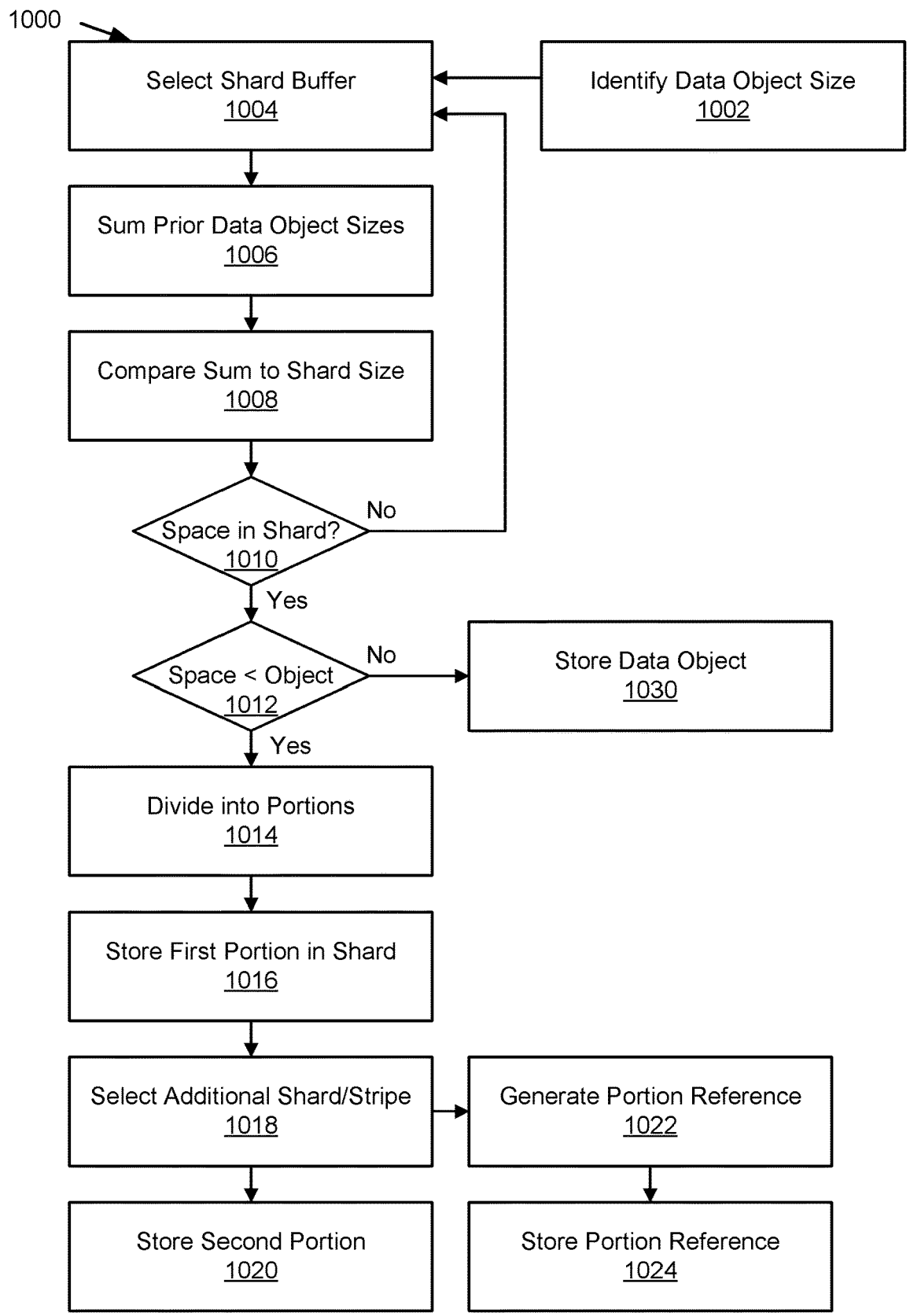
FIG. 10 illustrates an example method of handling data objects by dividing them across shards.

As shown in FIG. 10, the storage systems shown and described with regard to FIGS. 1-7 may be operated according to an example method of erasure coding data objects in portions to better fit available shard space, i.e. according to the method 1000 illustrated by the blocks 1002-1030 of FIG. 10. In some embodiments, method 1000 may operate in conjunction with methods 800 and/or 900 in FIGS. 8 and 9 respectively.

At block 1002, the data object size of a data object received for storage may be identified. For example, a data object received in a storage request may include an object size value in the parameters of the request and/or metadata associated with the data object.

At block 1004, a shard buffer is selected to receive data objects for storage. For example, a shard buffer with an open data shard and remaining space less than the size of the data objects may be selected to receive data objects.

At block 1006, the data object sizes of the prior data objects written or allocated to a particular data shard may be summed. For example, an aggregate data size for data objects written to a data shard may be modified each time a new data object is written to that data shard, providing a current total of the data allocated in the data shard.

At block 1008, the sum of the prior data objects may be compared to shard size to determine available space in the shard. For example, the sum of the prior data objects may be subtracted from a predetermined shard size and the difference may give an available space value. In some embodiments, data shards may have variable sizes and a more complex logic may be applied to calculating available space, such as based on thresholds (e.g., minimum shard size, maximum shard size, and/or target shard size).

At block 1010, whether there is space in the data shard may be evaluated. For example, the available space value may be checked and, if it above zero or a minimal space value, it may be determined that there is effective space remaining in the data shard. If yes, there is available space and method 1000 may proceed to block 1012. If no, the data shard should be closed and method 1000 may return to block 1006 to select another target data shard.

At block 1012, whether the data object is larger than the available space may be evaluated. For example, the data object size may be compared to the available space value to determine whether the data object is too large for the available space. If yes, the data object is larger than the available space and method 1000 may proceed to block 1014 for handling partial objects. If no, then the object may be written to the data shard as normal and method 1000 may proceed to block 1030 to store the data object, such as in accordance with methods 800 and/or 900 in FIGS. 8 and 9 respectively.

At block 1014, the data object may be divided into smaller portions. For example, a first portion equal to available space may be created, leaving a second or remainder portion equal to the difference between the data object size and the available space. The first portion and the second portion may each have their own effective data object size for allocation to data shards.

At block 1016, the first portion may be stored in the data shard. For example, the first portion may be treated as a data object with a size equal to or under the available space and written to the data shard, resulting in the data shard being full and closed.

At block 1018, an additional shard may be selected for receiving the second portion. For example, a next data shard or open data shard in the same placement group may be selected to receive the second portion and treat it as a data object with a data object size reflecting the remainder of the data not included in the first portion. If all data shards in the stripe are full, then a data shard in a next redundancy stripe may be selected. In some embodiments, a reference pointer may be used to locate the portions of a divided data object and method 1000 may proceed to block 1022.

At block 1020, the second portion may be stored in the newly selected data shard to complete the allocation of the data object. For example, the second portion may be written to the new data shard and processing of that new data shard may proceed as normal, such as in accordance with methods 800 and/or 900 in FIGS. 8 and 9 respectively and method 1000 may end. In some embodiments, the new data shard may be in a new redundancy stripe, such as where the first portion completed the prior redundancy stripe.

At block 1022, a portion reference identifier, such as a pointer may be generated to indicate the location of one portion from the other portion. For example, a shard identifier for the first portion may be associated with the GUID or similar identifier of the data object and a reference pointer indicating the shard identifier associated with the second portion may be generated for locating the second portion.

At block 1024, the portion reference may be stored in a location associated with the other portion. For example, the reference pointer indicating the location of the other portion may be stored in a header value, metadata tag, or metadata table entry for the first portion.

Figure 11:
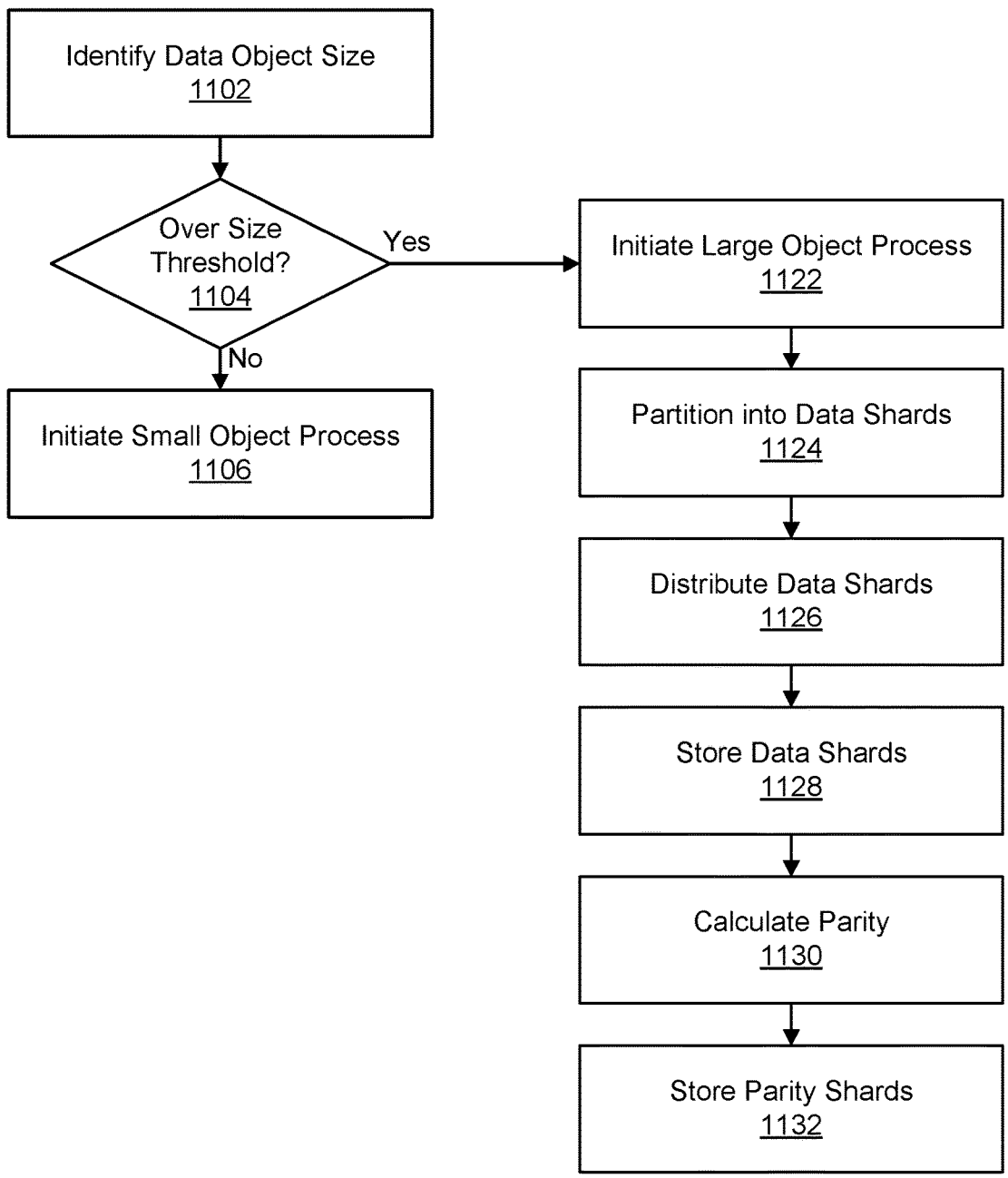
FIG. 11 illustrates an example method of selecting between small object and large object handling.

As shown in FIG. 11, the storage systems shown and described with regard to FIGS. 1-7 may be operated according to an example method of erasure coding data objects based on object size, i.e. according to the method 1100 illustrated by the blocks 1102-1132 of FIG. 11. In some embodiments, method 1100 may operate in conjunction with methods 800, 900, and/or 1000 in FIGS. 8, 9, and/or 10 respectively.

At block 1102, the data object size of a data object received for storage may be identified. For example, a data object received in a storage request may include an object size value in the parameters of the request and/or metadata associated with the data object.

At block 1104, the data object size may be compared to a size threshold to determine an object erasure coding path. For example, the data object size may be compared to a small object threshold to determine whether the data object exceeds the small object threshold. If yes, the data object is larger than the small object threshold and may be processed through a large object path, so method 1100 may proceed to block 1122. If no, the data object is classified as a small data object and may be processed in accordance with methods similar to methods 800 and/or 900 in FIGS. 8 and 9 respectively. Method 1100 may proceed to 1106 to initiate a small object process as described above.

At block 1022, a large object handling process may be initiated. For example, data objects above the small data object size threshold may be handled using an alternate erasure coding path based on partitioning data objects across the storage nodes of a placement group.

At block 1024, the large data object may be partitioned into data shards. For example, the large data object may be divided equally into data shards among the storage nodes. Other algorithms for partitioning large data object among data shards for erasure coding are also known.

At block 1026, the data shards corresponding to the large data object may be distributed among the storage nodes in the placement group. For example, a distributor hash function may determine which data shards are sent as symbols to which storage nodes in the group.

At block 1028, the data shards may be stored in their respective storage nodes. For example, as each storage node receives the data shard it may be initially stored in a shard buffer and/or written directly to permanent storage.

At block 1030, parity may be calculated based on the data shards. For example, each data shard may be processed through a parity calculator to generate a corresponding parity shard.

At block 1032, the parity shards may be stored in a designated number of parity nodes. For example, the parity shards may be redundantly stored at a plurality of storage nodes designated as parity nodes for the redundancy stripe to achieve the desired level of redundancy.

While at least one exemplary embodiment has been presented in the foregoing detailed description of the technology, it should be appreciated that a vast number of variations may exist. It should also be appreciated that an exemplary embodiment or exemplary embodiments are examples, and are not intended to limit the scope, applicability, or configuration of the technology in any way. Rather, the foregoing detailed description will provide those skilled in the art with a convenient road map for implementing an exemplary embodiment of the technology, it being understood that various modifications may be made in a function and/or arrangement of elements described in an exemplary embodiment without departing from the scope of the technology, as set forth in the appended claims and their legal equivalents.

As will be appreciated by one of ordinary skill in the art, various aspects of the present technology may be embodied as a system, method, or computer program product. Accordingly, some aspects of the present technology may take the form of an entirely hardware embodiment, an entirely software embodiment (including firmware, resident software, micro-code, etc.), or a combination of hardware and software aspects that may all generally be referred to herein as a circuit, module, system, and/or network. Furthermore, various aspects of the present technology may take the form of a computer program product embodied in one or more computer-readable mediums including computer-readable program code embodied thereon.

Any combination of one or more computer-readable mediums may be utilized. A computer-readable medium may be a computer-readable signal medium or a physical computer-readable storage medium. A physical computer readable storage medium may be, for example, but not limited to, an electronic, magnetic, optical, crystal, polymer, electromagnetic, infrared, or semiconductor system, apparatus, or device, etc., or any suitable combination of the foregoing. Non-limiting examples of a physical computer-readable storage medium may include, but are not limited to, an electrical connection including one or more wires, a portable computer diskette, a hard disk, random access memory (RAM), read-only memory (ROM), an erasable programmable read-only memory (EPROM), an electrically erasable programmable read-only memory (EEPROM), a Flash memory, an optical fiber, a compact disk read-only memory (CD-ROM), an optical processor, a magnetic processor, etc., or any suitable combination of the foregoing. In the context of this document, a computer-readable storage medium may be any tangible medium that can contain or store a program or data for use by or in connection with an instruction execution system, apparatus, and/or device.

Computer code embodied on a computer-readable medium may be transmitted using any appropriate medium, including but not limited to, wireless, wired, optical fiber cable, radio frequency (RF), etc., or any suitable combination of the foregoing. Computer code for carrying out operations for aspects of the present technology may be written in any static language, such as the C programming language or other similar programming language. The computer code may execute entirely on a user's computing device, partly on a user's computing device, as a stand-alone software package, partly on a user's computing device and partly on a remote computing device, or entirely on the remote computing device or a server. In the latter scenario, a remote computing device may be connected to a user's computing device through any type of network, or communication system, including, but not limited to, a local area network (LAN) or a wide area network (WAN), Converged Network, or the connection may be made to an external computer (e.g., through the Internet using an Internet Service Provider).

Various aspects of the present technology may be described above with reference to flowchart illustrations and/or block diagrams of methods, apparatus, systems, and computer program products. It will be understood that each block of a flowchart illustration and/or a block diagram, and combinations of blocks in a flowchart illustration and/or block diagram, can be implemented by computer program instructions. These computer program instructions may be provided to a processing device (processor) of a general purpose computer, special purpose computer, or other programmable data processing apparatus to produce a machine, such that the instructions, which can execute via the processing device or other programmable data processing apparatus, create means for implementing the operations/acts specified in a flowchart and/or block(s) of a block diagram.

Some computer program instructions may also be stored in a computer-readable medium that can direct a computer, other programmable data processing apparatus, or other device(s) to operate in a particular manner, such that the instructions stored in a computer-readable medium to produce an article of manufacture including instructions that implement the operation/act specified in a flowchart and/or block(s) of a block diagram. Some computer program instructions may also be loaded onto a computing device, other programmable data processing apparatus, or other device(s) to cause a series of operational steps to be performed on the computing device, other programmable apparatus or other device(s) to produce a computer-implemented process such that the instructions executed by the computer or other programmable apparatus provide one or more processes for implementing the operation(s)/act(s) specified in a flowchart and/or block(s) of a block diagram.

A flowchart and/or block diagram in the above figures may illustrate an architecture, functionality, and/or operation of possible implementations of apparatus, systems, methods, and/or computer program products according to various aspects of the present technology. In this regard, a block in a flowchart or block diagram may represent a module, segment, or portion of code, which may comprise one or more executable instructions for implementing one or more specified logical functions. It should also be noted that, in some alternative aspects, some functions noted in a block may occur out of an order noted in the figures. For example, two blocks shown in succession may, in fact, be executed substantially concurrently, or blocks may at times be executed in a reverse order, depending upon the operations involved. It will also be noted that a block of a block diagram and/or flowchart illustration or a combination of blocks in a block diagram and/or flowchart illustration, can be implemented by special purpose hardware-based systems that may perform one or more specified operations or acts, or combinations of special purpose hardware and computer instructions.

While one or more aspects of the present technology have been illustrated and discussed in detail, one of ordinary skill in the art will appreciate that modifications and/or adaptations to the various aspects may be made without departing from the scope of the present technology, as set forth in the following claims.

What is claimed is:

1. A system, comprising:
a first storage node in a plurality of storage nodes, wherein:
the first storage node is configured to store a first data shard having a first data shard size;
the first data shard is configured to contain a first plurality of data objects; and
a sum of data object sizes of the first plurality of data objects does not exceed the first data shard size;
a second storage node in the plurality of storage nodes, wherein:
the second storage node is configured to store a second data shard having a second data shard size;
the second data shard is configured to contain a second plurality of data objects; and
a sum of data object sizes of the second plurality of data objects does not exceed the second data shard size; and
a third storage node in the plurality of storage nodes, wherein:
the first storage node is further configured to copy a mirrored first data shard containing the first plurality of data objects to the third storage node;
the second storage node is further configured to copy a mirrored second data shard containing the second plurality of data objects to the third storage node; and
the third storage node is configured to store a parity shard configured to contain parity data for both the first data shard and the second data shard.

2. The system of claim 1, wherein:
the first data shard is configured to include a first portion of a partial data object; and
the second data shard is configured to include a second portion of the partial data object.

3. The system of claim 1, wherein:
the parity data is associated with a redundancy stripe for the first data shard and the second data shard;
the first data shard is configured to include a remainder portion of a partial data object; and
a prior redundancy stripe is configured to include a prior portion of the partial data object.

4. The system of claim 1, wherein the first data shard size is different than the second data shard size.

5. The system of claim 1, wherein:
the first storage node includes:
a first shard buffer; and
a first non-volatile storage medium;
the first storage node is further configured to:
store the first plurality of data objects to the first shard buffer; and
close the first shard buffer to receiving additional data objects; and
store, responsive to closing the first shard buffer, the first data shard to the first non-volatile storage medium; and copying the mirrored first data shard to the third storage node is performed responsive to closing the first shard buffer.

6. The system of claim 1, wherein:
a plurality of data shards comprising a redundancy stripe include the first data shard and the second data shard; and
the third storage node is further configured to:
determine that the plurality of data shards comprising the redundancy stripe are complete; and
calculate, responsive to determining that the plurality of data shards are complete, the parity shard based on the mirrored first data shard and the mirrored second data shard.

7. The system of claim 1, further comprising:
a distributor configured to:
receive a plurality of storage requests for a requested plurality of data objects;
execute a distributor function for the requested plurality of data objects to select, for each data object in the requested plurality of data objects, a target storage node from the plurality of storage nodes, wherein the distributor function is configured to allocate complete data objects to a target data shard for the target storage node until a next data object exceeds a target data shard size; and
distribute the requested plurality of data objects to the target storage nodes from the plurality of storage nodes, wherein the requested plurality of data objects includes the first plurality of data objects and the second plurality of data objects.

8. The system of claim 7, wherein the distributor is further configured to:
determine whether an object size of a new data object exceeds a small object threshold; and
partition, responsive to determining that the object size of the new data object exceeds the small object threshold, the new data object into a plurality of data shards distributed across the plurality of storage nodes in a new redundancy stripe.

9. The system of claim 7, further comprising:
a controller node configured to:
receive confirmation, for each data object of the requested plurality of data objects, of mirrored data shards stored in at least two storage nodes of the plurality of storage nodes; and
confirm, responsive to receiving confirmation of mirrored data shards for each data object, storage to a host system for each data object, wherein:
the controller node is configured to confirm storage prior to calculation of at least one parity shard for a redundancy stripe; and
a plurality of data shards, including the first data shard and the second data shard, comprises the redundancy stripe.

10. A computer-implemented method, comprising:
storing, in a first data shard in a first storage node, a first plurality of data objects, wherein:
the first data shard has a first data shard size; and
a sum of data object sizes of the first plurality of data objects does not exceed the first data shard size;
storing, in a second data shard in a second storage node, a second plurality of data objects, wherein:
the second data shard has a second data shard size; and
a sum of data object sizes of the second plurality of data objects does not exceed the second data shard size;

copying, from the first storage node to a third storage node, a mirrored first data shard containing the first plurality of data objects;

copying, from the second storage node to the third storage node, a mirrored second data shard containing the second plurality of data objects; and storing, in the third storage node, a parity shard configured to contain parity data for both the first data shard and the second data shard.

11. The computer-implemented method of claim 10, further comprising:

dividing a selected data object into a first portion and a second portion;

storing, in the first data shard in the first storage node, the first portion of the selected data object; and storing, in the second data shard in the second storage node, the second portion of the selected data object.

12. The computer-implemented method of claim 10, further comprising:

dividing a selected data object into a prior portion and a remainder portion;

storing, among a plurality of storage nodes, a prior redundancy stripe including the prior portion of the selected data object; and storing, in the first data shard in the first storage node, the remainder portion of the selected data object.

13. The computer-implemented method of claim 10, wherein the first data shard size is different than the second data shard size.

14. The computer-implemented method of claim 10, further comprising:

selecting a first shard buffer in the first storage node;

storing the first plurality of data objects to the first shard buffer;

closing the first shard buffer to receiving additional data objects; and storing, responsive to closing the first shard buffer, the first data shard to a first non-volatile storage medium in the first storage node, wherein copying the mirrored first data shard to the third storage node is performed responsive to closing the first shard buffer.

15. The computer-implemented method of claim 10, further comprising:

determining, by the third storage node, that a plurality of data shards comprising a redundancy stripe are complete, wherein the plurality of data shards includes the first data shard and the second data shard; and calculating, by the third storage node and responsive to determining that the plurality of data shards are complete, the parity shard based on the mirrored first data shard and the mirrored second data shard.

16. The computer-implemented method of claim 10, further comprising:

receiving a plurality of storage requests for a requested plurality of data objects;

selecting, for each data object in the requested plurality of data objects, a target storage node from a plurality of storage nodes using a distributor function, wherein the distributor function is configured to allocate complete data objects to a target data shard for the target storage node until a next data object exceeds a target data shard size; and distributing the requested plurality of data objects to the target storage nodes from the plurality of storage nodes, wherein:

the requested plurality of data objects includes the first plurality of data objects and the second plurality of data objects; and the plurality of storage nodes includes the first storage node and the second storage node.

17. The computer-implemented method of claim 16, further comprising:

determining whether an object size of a new data object exceeds a small object threshold; and partitioning, responsive to determining that the object size of the new data object exceeds the small object threshold, the new data object into a plurality of data shards distributed across the plurality of storage nodes in a new redundancy stripe.

18. The computer-implemented method of claim 16, further comprising:

mirroring, from a plurality of data shards comprising a redundancy stripe, each data object of the requested plurality of data objects among at least two storage nodes of a plurality of storage nodes including the first storage node, the second storage node, and the third storage node;

confirming, responsive to mirroring each data object of the requested plurality of data objects, storage to a host system for each data object prior to calculation of at least one parity shard for the redundancy stripe;

determining that the plurality of data shards comprising the redundancy stripe is complete; and calculating, responsive to determining that the plurality of data shards is complete, at least one parity shard for the redundancy stripe.

19. A system, comprising:

a plurality of storage nodes including a first storage node, a second storage node, and a third storage node;

means for storing, in a first data shard in the first storage node, a first plurality of data objects, wherein:

the first data shard has a first data shard size; and a sum of data object sizes of the first plurality of data objects does not exceed the first data shard size;

means for storing, in a second data shard in the second storage node, a second plurality of data objects, wherein:

the second data shard has a second data shard size; and a sum of data object sizes of the second plurality of data objects does not exceed the second data shard size;

means for copying, from the first storage node to a third storage node, a mirrored first data shard containing the first plurality of data objects;

means for copying, from the second storage node to the third storage node, a mirrored second data shard containing the second plurality of data objects; and means for storing, in the third storage node, a parity shard configured to contain parity data for both the first data shard and the second data shard.

20. The system of claim 19, further comprising:

means for dividing a selected data object into a first portion and a second portion;

means for storing, in the first data shard in the first storage node, the first portion of the selected data object; and means for storing, in the second data shard in the second storage node, the second portion of the selected data object.

* * * * *